United States Patent [19]
Cho

[11] Patent Number: 5,627,844
[45] Date of Patent: May 6, 1997

[54] ADDRESS GENERATOR FOR EFM DECODER EMPLOYING SCRAMBLING COUNTERS

[75] Inventor: Yong-hee Cho, Seoul, Rep. of Korea

[73] Assignee: Samsung Electronics Co., Ltd., Kyungki-do, Rep. of Korea

[21] Appl. No.: 230,903

[22] Filed: Apr. 21, 1994

[30] Foreign Application Priority Data

Apr. 21, 1993 [KR] Rep. of Korea .................... 1993-6740

[51] Int. Cl.⁶ .................................................. G11B 20/18
[52] U.S. Cl. ...................... 371/40.1; 371/37.5; 371/40.3
[58] Field of Search ........................... 371/37.4, 37.5, 371/37.7, 40.1, 40.3, 2.2

[56] References Cited

U.S. PATENT DOCUMENTS

| | | | |
|---|---|---|---|
| 4,398,224 | 8/1983 | Waranabe | 371/37.7 X |
| 4,539,605 | 9/1985 | Hoshino et al. | 360/32 |
| 4,683,572 | 7/1987 | Baggen et al. | 371/37.5 |
| 4,707,805 | 11/1987 | Narusawa et al. | 371/37.5 X |
| 4,716,567 | 12/1987 | Ito et al. | 371/40 |
| 4,748,628 | 5/1988 | Moriwaki | 371/37.5 X |
| 4,860,272 | 8/1989 | Nishikawa et al. | 369/48 |
| 4,928,185 | 5/1990 | Kobayashi et al. | 360/19.1 |
| 5,051,998 | 9/1991 | Murai et al. | 371/39.1 |
| 5,206,851 | 4/1993 | Cho | 369/48 |
| 5,276,827 | 1/1994 | Delaruelle et al. | 371/37.7 X |
| 5,367,410 | 11/1994 | McCarthy | 360/48 |
| 5,400,347 | 3/1995 | Lee | 371/37.5 |
| 5,471,442 | 11/1995 | Shimizume | 369/32 |
| 5,553,048 | 9/1996 | Maeda | 369/60 |

OTHER PUBLICATIONS

Millman, J., et al., "Microelectronics", McGraw-Hill Book Co., p. 301. Jan. 1987.

*Primary Examiner*—Stephen M. Baker
*Attorney, Agent, or Firm*—Sughrue, Mion, Zinn, Macpeak & Seas

[57] ABSTRACT

An address generator in the demodulator for an optical disk system generates addresses necessary for recording demodulated EFM in a predetermined area of a memory in the demodulator of an optical disk system, reading and recording the data for an error detection and correction of an EFM demodulation signal, and reading the data for converting digital signals for performing error correction into analog signals by using a scrambling counter and a decoder, thereby enabling quick generation of addresses while reducing chip space.

23 Claims, 28 Drawing Sheets

FIG. 5A

| EFM COUNTER (DECIMAL NUMBER) | DAC COUNTER (DECIMAL NUMBER) |
|---|---|
| 206 | 995 |
| 455 | 317 |
| 702 | 65 |
| 951 | 1739 |
| 1198 | 1829 |
| 1447 | 1577 |
| 1694 | 2481 |
| 1943 | 3481 |
| 2190 | 3729 |
| 2439 | 3225 |
| 2686 | 1993 |
| 2935 | 2241 |
| 3182 | 1243 |
| 3431 | 821 |
| 3678 | 569 |
| 3927 | 1987 |
| 3808 | 2333 |
| 3557 | 2081 |
| 3304 | 2729 |
| 3053 | 2985 |
| 2800 | 3233 |
| 2549 | 3473 |
| 2296 | 1497 |
| 2045 | 1745 |
| 1792 | 1491 |
| 1541 | 1325 |
| 1288 | 1073 |
| 1037 | 2235 |
| 784 | 2837 |
| 533 | 2585 |
| 280 | 2977 |
| 29 | 2489 |
|  | 2737 |
|  | 3721 |
|  | 1001 |
|  | 1249 |

C1 DECODER COUNTER

| INPUT (BINARY NUMBER) | OUTPUT (DECIMAL NUMBER) |
|---|---|
| 11111 | 174 |
| 11110 | 422 |
| 11101 | 670 |
| 11100 | 918 |
| 11011 | 1166 |
| 11010 | 1414 |
| 11001 | 1662 |
| 11000 | 1910 |
| 10111 | 2158 |
| 10110 | 2406 |
| 10101 | 2654 |
| 10100 | 2902 |
| 10011 | 3150 |
| 10010 | 3398 |
| 10001 | 3646 |
| 10000 | 3894 |
| 01111 | 3776 |
| 01110 | 3524 |
| 01101 | 3272 |
| 01100 | 3020 |
| 01011 | 2768 |
| 01010 | 2516 |
| 01001 | 2264 |
| 01000 | 2012 |
| 00111 | 1760 |
| 00110 | 1508 |
| 00101 | 1256 |
| 00100 | 1004 |
| 00011 | 752 |
| 00010 | 500 |
| 00001 | 248 |
| 00000 | 4092 |

C2 DECODER COUNTER

| INPUT (BINARY NUMBER) | OUTPUT (DECIMAL NUMBER) |
|---|---|
| 11011 | 66 |
| 11010 | 318 |
| 11001 | 570 |
| 11000 | 822 |
| 10111 | 1074 |
| 10110 | 1326 |
| 10101 | 15798 |
| 10100 | 1830 |
| 10011 | 2082 |
| 10010 | 2334 |
| 10001 | 2586 |
| 10000 | 2838 |
| 01111 | 3090 |
| 01110 | 3342 |
| 01101 | 3594 |
| 01100 | 3846 |
| 01011 | 3732 |
| 01010 | 3484 |
| 01001 | 3236 |
| 01000 | 2988 |
| 00111 | 2740 |
| 00110 | 2492 |
| 00101 | 2244 |
| 00100 | 1996 |
| 00011 | 1748 |
| 00010 | 1500 |
| 00001 | 1252 |
| 00000 | 1004 |

C1P DECODER COUNTER

| INPUT (BINARY NUMBER) | OUTPUT (DECIMAL NUMBER) |
|---|---|
| 11011 | 3968 |
| 11010 | 3972 |
| 11001 | 3976 |
| 11000 | 3980 |
| 10111 | 3984 |
| 10110 | 3988 |
| 10101 | 3992 |
| 10100 | 3996 |
| 10011 | 4000 |
| 10010 | 4004 |
| 10001 | 4008 |
| 10000 | 4012 |
| 01111 | 4016 |
| 01110 | 4020 |
| 01101 | 4024 |
| 01100 | 4028 |
| 01011 | 4032 |
| 01010 | 4036 |
| 01001 | 4040 |
| 01000 | 4044 |
| 00111 | 4048 |
| 00110 | 4052 |
| 00101 | 4056 |
| 00100 | 4060 |
| 00011 | 4064 |
| 00010 | 4068 |
| 00001 | 4072 |
| 00000 | 4076 |

C2P DECODER COUNTER

| INPUT (BINARY NUMBER) | OUTPUT (DECIMAL NUMBER) |
|---|---|
| 01011 | 996 |
| 01010 | 1244 |
| 01001 | 1492 |
| 01000 | 1740 |
| 00111 | 1988 |
| 00110 | 2236 |
| 00101 | 2484 |
| 00100 | 2732 |
| 00011 | 2980 |
| 00010 | 3228 |
| 00001 | 3476 |
| 00000 | 3724 |

FIG. 10A

| DEMODULATED EFM SYMBOL | | OUTPUT ADDRESS (EFMQ) | | | | | SIGNAL | | |
|---|---|---|---|---|---|---|---|---|---|
| | | (DEC) | (HEX) | (MSB) | | | (LSB) | (MSB) | | (LSB) |
| L6n { | EF31 | 000 | 0000 | 0000 | 0000 | 0000 | 0000 | 0000 | 1100 | 1110 |
| | EF30 | 206 | 00CE | 0000 | 1100 | 1100 | 1110 | 0001 | 0000 | 1001 |
| L6n+2 { | EF29 | 455 | 01C7 | 0001 | 1100 | 0111 | 0111 | 0011 | 0111 | 1001 |
| | EF28 | 702 | 02BE | 0010 | 1011 | 1011 | 1110 | 0001 | 0000 | 1001 |
| L6n+A { | EF27 | 951 | 03B7 | 0011 | 1011 | 0111 | 0111 | 0111 | 0001 | 1001 |
| | EF26 | 1198 | 04AE | 0100 | 1010 | 1010 | 1110 | 0001 | 0000 | 1001 |
| R6n { | EF25 | 1447 | 05A7 | 0101 | 1010 | 0111 | 0111 | 0011 | 0011 | 1001 |
| | EF24 | 1694 | 069E | 0110 | 1001 | 1001 | 1110 | 0001 | 0000 | 1001 |
| R6n+2 { | EF23 | 1943 | 0797 | 0111 | 1001 | 0111 | 0111 | 1111 | 0001 | 1001 |
| | EF22 | 2190 | 088E | 1000 | 1000 | 1000 | 1110 | 0001 | 0000 | 1001 |
| R6n+4 { | EF21 | 2439 | 0987 | 1001 | 1000 | 0111 | 0111 | 0011 | 1111 | 1001 |
| | EF20 | 2686 | 0A7E | 1010 | 0111 | 0111 | 1110 | 0001 | 0000 | 1001 |
| | EF19 | 2935 | 0B77 | 1011 | 0111 | 0111 | 0111 | 0111 | 0000 | 1001 |
| C2 PARITY { | EF18 | 3182 | 0C6E | 1100 | 0110 | 0110 | 1110 | 0001 | 0000 | 1001 |
| | EF17 | 3431 | 0D67 | 1101 | 0110 | 0101 | 0111 | 0011 | 0011 | 1001 |
| | EF16 | 3678 | 0E5E | 1110 | 0101 | 0101 | 1110 | 0001 | 0000 | 1001 |
| | | 3927 | 0F57 | 1111 | 0101 | 0001 | 0111 | 0001 | 1011 | 0111 |
| R6n+1 { | EF15 | 3808 | 0EE0 | 1110 | 1110 | 1110 | 0000 | 0011 | 0000 | 0101 |
| | EF14 | 3557 | 0DE5 | 1101 | 1101 | 1110 | 0101 | 0001 | 0000 | 1101 |
| R6n+3 { | EF13 | 3304 | 0CE8 | 1100 | 1100 | 1110 | 1000 | 0111 | 0000 | 0101 |
| | EF12 | 3053 | 0BED | 1011 | 1011 | 1110 | 1101 | 0001 | 0000 | 1101 |
| R6n+5 { | EF11 | 2800 | 0AF0 | 1010 | 1010 | 1111 | 0000 | 0011 | 0000 | 0101 |
| | EF10 | 2549 | 09F5 | 1001 | 1001 | 1111 | 0101 | 0001 | 0000 | 1101 |
| R6n+1 { | EF 9 | 2296 | 08F8 | 1000 | 1000 | 1111 | 1000 | 0111 | 0000 | 0101 |
| | EF 8 | 2045 | 07FD | 0111 | 0111 | 1111 | 1101 | 1111 | 1111 | 1101 |
| R6n+3 { | EF 7 | 1792 | 0700 | 0111 | 0110 | 0000 | 0000 | 0000 | 0000 | 0101 |
| | EF 6 | 1541 | 0605 | 0110 | 0101 | 0000 | 0101 | 0011 | 0000 | 1101 |
| R6n+5 { | EF 5 | 1288 | 0508 | 0101 | 0100 | 0000 | 1000 | 0111 | 0000 | 0101 |
| | EF 4 | 1037 | 040D | 0100 | 0011 | 0000 | 1101 | 0001 | 0000 | 1101 |
| C1 PARITY { | EF 3 | 784 | 0310 | 0011 | 0010 | 0001 | 0000 | 0011 | 0000 | 0101 |
| | EF 2 | 533 | 0215 | 0010 | 0001 | 0001 | 0101 | 0111 | 0000 | 1101 |
| | EF 1 | 280 | 0118 | 0001 | 0001 | 0001 | 1000 | 0011 | 0000 | 0101 |
| | EF ∅ | 29 | 001D | 0000 | 0000 | 0001 | 1101 | 0000 | 0001 | 1101 |

FIG. 10B

| SERIAL NO. | INPUT XCK | INPUT TEN | INPUT RB | OUTPUT(EFMQ) MSB | | LSB |
|---|---|---|---|---|---|---|
| 2980 | 1 | 1 | 0 | 0000 | 0000 | 0000 |
| 3080 | 0 | 1 | 1 | 0000 | 0000 | 0000 |
| 3180 | 1 | 1 | 1 | 0000 | 1100 | 1110 |
| 3280 | 0 | 1 | 1 | 0000 | 1100 | 1110 |
| 3380 | 1 | 1 | 1 | 0001 | 1100 | 0111 |
| 3480 | 0 | 1 | 1 | 0001 | 1100 | 0111 |
| 3580 | 1 | 1 | 1 | 0010 | 1011 | 1110 |
| 3680 | 0 | 1 | 1 | 0010 | 1011 | 1110 |
| 3780 | 1 | 1 | 1 | 0011 | 1011 | 0111 |
| 3880 | 0 | 1 | 1 | 0011 | 1011 | 0111 |
| 3980 | 1 | 1 | 1 | 0100 | 1010 | 1110 |
| 4080 | 0 | 1 | 1 | 0100 | 1010 | 1110 |
| 4180 | 1 | 1 | 1 | 0101 | 1010 | 0111 |
| 4280 | 0 | 1 | 1 | 0101 | 1010 | 0111 |
| 4380 | 1 | 1 | 1 | 0110 | 1001 | 1110 |
| 4480 | 0 | 1 | 1 | 0110 | 1001 | 1110 |
| 4580 | 1 | 1 | 1 | 0111 | 1001 | 0111 |
| 4680 | 0 | 1 | 1 | 0111 | 1001 | 0111 |
| 4780 | 1 | 1 | 1 | 1000 | 1000 | 1110 |
| 4880 | 0 | 1 | 1 | 1000 | 1000 | 1110 |
| 4980 | 1 | 1 | 1 | 1001 | 1000 | 0111 |
| 5080 | 0 | 1 | 1 | 1001 | 1000 | 0111 |
| 5180 | 1 | 1 | 1 | 1010 | 0111 | 1110 |
| 5280 | 0 | 1 | 1 | 1010 | 0111 | 1110 |
| 5380 | 1 | 1 | 1 | 1011 | 0111 | 0111 |
| 5480 | 0 | 1 | 1 | 1011 | 0111 | 0111 |
| 5580 | 1 | 1 | 1 | 1100 | 0110 | 1110 |
| 5680 | 0 | 1 | 1 | 1100 | 0110 | 1110 |
| 5780 | 1 | 1 | 1 | 1101 | 0110 | 0111 |
| 5880 | 0 | 1 | 1 | 1101 | 0110 | 0111 |
| 5980 | 1 | 1 | 1 | 1110 | 0101 | 1110 |
| 6080 | 0 | 1 | 1 | 1110 | 0101 | 1110 |
| 6180 | 1 | 1 | 1 | 1111 | 0101 | 0111 |
| 6280 | 0 | 1 | 1 | 1111 | 0101 | 0111 |
| 6380 | 1 | 1 | 1 | 1110 | 1110 | 0000 |
| 6480 | 0 | 1 | 1 | 1110 | 1110 | 0000 |
| 6580 | 1 | 1 | 1 | 1101 | 1110 | 0101 |
| 6680 | 0 | 1 | 1 | 1101 | 1110 | 0101 |
| 6780 | 1 | 1 | 1 | 1100 | 1110 | 1000 |
| 6880 | 0 | 1 | 1 | 1100 | 1110 | 1000 |
| 6980 | 1 | 1 | 1 | 1011 | 1110 | 1101 |
| 7080 | 0 | 1 | 1 | 1011 | 1110 | 1101 |
| 7180 | 1 | 1 | 1 | 1010 | 1111 | 0000 |
| 7280 | 0 | 1 | 1 | 1010 | 1111 | 0000 |
| 7380 | 1 | 1 | 1 | 1001 | 1111 | 0101 |
| 7480 | 0 | 1 | 1 | 1001 | 1111 | 0101 |
| 7580 | 1 | 1 | 1 | 1000 | 1111 | 1000 |
| 7680 | 0 | 1 | 1 | 1000 | 1111 | 1000 |
| 7780 | 1 | 1 | 1 | 0111 | 1111 | 1101 |
| 7880 | 0 | 1 | 1 | 0111 | 1111 | 1101 |
| 7980 | 1 | 1 | 1 | 0111 | 0000 | 0000 |
| 8080 | 0 | 1 | 1 | 0111 | 0000 | 0000 |
| 8180 | 1 | 1 | 1 | 0110 | 0000 | 0101 |
| 8280 | 0 | 1 | 1 | 0110 | 0000 | 0101 |
| 8380 | 1 | 1 | 1 | 0101 | 0000 | 1000 |
| 8480 | 0 | 1 | 1 | 0101 | 0000 | 1000 |
| 8580 | 1 | 1 | 1 | 0100 | 0000 | 1101 |
| 8680 | 0 | 1 | 1 | 0100 | 0000 | 1101 |
| 8780 | 1 | 1 | 1 | 0011 | 0001 | 0000 |
| 8880 | 0 | 1 | 1 | 0011 | 0001 | 0000 |
| 8980 | 1 | 1 | 1 | 0010 | 0001 | 0101 |
| 9080 | 0 | 1 | 1 | 0010 | 0001 | 0101 |
| 9180 | 1 | 1 | 1 | 0001 | 0001 | 1000 |
| 9280 | 0 | 1 | 1 | 0001 | 0001 | 1000 |
| 9380 | 1 | 1 | 1 | 0000 | 0001 | 1101 |
| 9480 | 0 | 1 | 1 | 0000 | 0001 | 1101 |

FIG. 12

| INPUT(RELATIVE ADDRESS) | OUTPUT(ABSOLUTE ADDRESS) | | | |
|---|---|---|---|---|
| (BINARY) | (DEC) | (HEX) | (BIN) (MSB) | (LSB) |
| L6n (11111) | 174 | 00AE | 0000 1010 | 1110 |
| (11110) | 422 | 01A6 | 0001 1010 | 0110 |
| L6n+2 (11101) | 670 | 029E | 0010 1001 | 1110 |
| (11100) | 918 | 0396 | 0011 1001 | 0110 |
| L6n+4 (11011) | 1166 | 048E | 0100 1000 | 1110 |
| (11010) | 1414 | 0586 | 0101 1000 | 0110 |
| R6n (11001) | 1662 | 067E | 0110 0111 | 1110 |
| (11000) | 1910 | 0776 | 0111 0111 | 0110 |
| R6n+2 (10111) | 2158 | 086E | 1000 0110 | 1110 |
| (10110) | 2406 | 0966 | 1001 0110 | 0110 |
| R6n+4 (10101) | 2654 | 0A5E | 1010 0101 | 1110 |
| (10100) | 2902 | 0B56 | 1011 0101 | 0110 |
| (10011) | 3150 | 0C4E | 1100 0100 | 1110 |
| C2 PARITY (10010) | 3398 | 0D46 | 1101 0100 | 0110 |
| (10001) | 3646 | 0E3E | 1110 0011 | 1110 |
| (10000) | 3894 | 0F36 | 1111 0011 | 0110 |
| (01111) | 3776 | 0EC0 | 1110 1100 | 0000 |
| L6n+2 (01110) | 3524 | 0DC4 | 1101 1100 | 0100 |
| (01101) | 3272 | 0CC8 | 1100 1100 | 1000 |
| L6n+2 (01100) | 3020 | 0BCC | 1011 1100 | 1100 |
| (01011) | 2768 | 0AD0 | 1010 1101 | 0000 |
| L6n+2 (01010) | 2516 | 09D4 | 1001 1101 | 0100 |
| (01001) | 2264 | 08D8 | 1000 1101 | 1000 |
| L6n+2 (01000) | 2012 | 07DC | 0111 1101 | 1100 |
| (00111) | 1760 | 06E0 | 0110 1110 | 0000 |
| L6n+2 (00110) | 1508 | 05E4 | 0101 1110 | 0100 |
| (00101) | 1256 | 04E8 | 0100 1110 | 1000 |
| L6n+2 (00100) | 1004 | 03EC | 0011 1110 | 1100 |
| (00011) | 752 | 02F0 | 0010 1111 | 0000 |
| L6n+2 (00010) | 500 | 01F4 | 0001 1111 | 0100 |
| (00001) | 248 | 00F8 | 0000 1111 | 1000 |
| C1 PARITY (00000) | 4092 | 0FFC | 1111 1111 | 1100 |

FIG. 14

| INPUT ADDRESS (TAO) | OUTPUT ADDRESS (C2Q) | | | |
|---|---|---|---|---|
| (BINARY) | (DEC) | (HEX) | (BIN) (MSB) | (LSB) |
| L6n (11011) | 66 | 0042 | 0000 | 0100 0010 |
| (11010) | 318 | 013E | 0001 | 0011 1110 |
| L6n+2 (11001) | 570 | 023A | 0010 | 0011 1010 |
| (11000) | 822 | 0336 | 0011 | 0011 0110 |
| L6n+4 (10111) | 1074 | 0432 | 0100 | 0011 0010 |
| (10110) | 1326 | 052E | 0101 | 0010 1110 |
| R6n (10101) | 1578 | 062A | 0110 | 0010 1010 |
| (10100) | 1830 | 0726 | 0111 | 0010 0110 |
| R6n+2 (10011) | 2082 | 0822 | 1000 | 0010 0010 |
| (10010) | 2334 | 091E | 1001 | 0001 1110 |
| R6n+4 (10001) | 2586 | 0A1A | 1010 | 0001 1010 |
| (10000) | 2838 | 0B16 | 1011 | 0001 0110 |
| (01111) | 3090 | 0C12 | 1100 | 0001 0010 |
| C2 PARITY (01110) | 3342 | 0D0E | 1101 | 0000 1110 |
| (01101) | 3594 | 0E0A | 1110 | 0000 1010 |
| (01100) | 3846 | 0F06 | 1111 | 0000 0110 |
| L6n+1 (01011) | 3732 | 0E94 | 1110 | 1001 0100 |
| (01010) | 3484 | 0D9C | 1101 | 1001 1100 |
| L6n+3 (01001) | 3236 | 0CA4 | 1100 | 1010 0100 |
| (01000) | 2988 | 0BAC | 1011 | 1010 1100 |
| L6n+5 (00111) | 2740 | 0AB4 | 1010 | 1011 0100 |
| (00110) | 2492 | 09BC | 1001 | 1011 1100 |
| R6n+1 (00101) | 2244 | 08C4 | 1000 | 1100 0100 |
| (00100) | 1996 | 07CC | 0111 | 1100 1100 |
| R6n+3 (00011) | 1748 | 06D4 | 0110 | 1101 0100 |
| (00010) | 1500 | 05DC | 0101 | 1101 1100 |
| R6n+5 (00001) | 1252 | 04E4 | 0100 | 1110 0100 |
| (00000) | 1004 | 03EC | 0011 | 1110 1100 |

FIG. 16

| INPUT ADDRESS(TAO) | | OUTPUT ADDRESS(CIPQ) | | | |
|---|---|---|---|---|---|
| | (BINARY) | (DEC) | (HEX) | (BIN) (MSB) | (LSB) |
| C1P27 | 11011 | 3968 | 0F80 | 1111 1000 | 0000 |
| C1P26 | 11010 | 3972 | 0F84 | 1111 1000 | 0100 |
| C1P25 | 11001 | 3976 | 0F88 | 1111 1000 | 1000 |
| C1P24 | 11000 | 3980 | 0F8C | 1111 1000 | 1100 |
| C1P23 | 10111 | 3984 | 0F90 | 1111 1001 | 0000 |
| C1P22 | 10110 | 3988 | 0F94 | 1111 1001 | 0100 |
| C1P21 | 10101 | 3992 | 0F98 | 1111 1001 | 1000 |
| C1P20 | 10100 | 3996 | 0F9C | 1111 1001 | 1100 |
| C1P19 | 10011 | 4000 | 0FA0 | 1111 1010 | 0000 |
| C1P18 | 10010 | 4004 | 0FA4 | 1111 1010 | 0100 |
| C1P17 | 10001 | 4008 | 0FA8 | 1111 1010 | 1000 |
| C1P16 | 10000 | 4012 | 0FAC | 1111 1010 | 1100 |
| C1P15 | 01111 | 4016 | 0FB0 | 1111 1011 | 0000 |
| C1P14 | 01110 | 4020 | 0FB4 | 1111 1011 | 0100 |
| C1P13 | 01101 | 4024 | 0FB8 | 1111 1011 | 1000 |
| C1P12 | 01100 | 4028 | 0FBC | 1111 1011 | 1100 |
| C1P11 | 01011 | 4032 | 0FC0 | 1111 1100 | 0000 |
| C1P10 | 01010 | 4036 | 0FC4 | 1111 1100 | 0100 |
| C1P9 | 01001 | 4040 | 0FC8 | 1111 1100 | 1000 |
| C1P8 | 01000 | 4044 | 0FC0 | 1111 1100 | 1100 |
| C1P7 | 00111 | 4048 | 0FD0 | 1111 1101 | 0000 |
| C1P6 | 00110 | 4052 | 0FD4 | 1111 1101 | 0100 |
| C1P5 | 00101 | 4056 | 0FD8 | 1111 1101 | 1000 |
| C1P4 | 00100 | 4060 | 0FDC | 1111 1101 | 1100 |
| C1P3 | 00011 | 4064 | 0FE0 | 1111 1110 | 0000 |
| C1P2 | 00010 | 4068 | 0FE4 | 1111 1110 | 0100 |
| C1P1 | 00001 | 4072 | 0FE8 | 1111 1110 | 1000 |
| C1P0 | 00000 | 4076 | 0FEC | 1111 1110 | 1100 |

FIG. 18

| INPUT ADDRESS (TA0) | OUTPUT ADDRESS (C2PQ) | | | |
|---|---|---|---|---|
| (BINARY) | (DEC) | (HEX) | (BIN) (MSB) | (LSB) |
| C2P0  01011 | 996  | 3E4 | 0011 1110 | 0100 |
| C2P1  01010 | 1244 | 4DC | 0100 1101 | 1100 |
| C2P2  01001 | 1492 | 5D4 | 0101 1101 | 0100 |
| C2P3  01000 | 1740 | 6CC | 0110 1100 | 1100 |
| C2P4  00111 | 1988 | 7C4 | 0111 1100 | 0100 |
| C2P5  00110 | 2236 | 8BC | 1000 1011 | 1100 |
| C2P6  00101 | 2484 | 9B4 | 1001 1011 | 0100 |
| C2P7  00100 | 2732 | AAC | 1010 1010 | 1100 |
| C2P8  00011 | 2980 | BA4 | 1011 1010 | 0100 |
| C2P9  00010 | 3228 | C9C | 1100 1001 | 1100 |
| C2P10 00001 | 3476 | A94 | 1101 1001 | 0100 |
| C2P11 00000 | 3724 | E8C | 1110 1000 | 1100 |

FIG. 20A

| | | OUTPUT ADDRESS (AT) | | | |
|---|---|---|---|---|---|
| | | (DEC) | (HEX) | (MSB) (BIN) | (LSB) |
| L6n { | DF0 | 995 | 03E3 | 0011 1110 | 0011 |
| | DA0 | 317 | 013D | 0001 0011 | 1101 |
| | DA1 | 65 | 0041 | 0000 0100 | 0001 |
| | DF2 | 1739 | 06CB | 0110 1100 | 1011 |
| R6n { | DA2 | 1829 | 0725 | 0111 0010 | 0101 |
| | DA3 | 1577 | 0629 | 0110 0010 | 1001 |
| | DF4 | 2481 | 09B1 | 1001 1011 | 0001 |
| L6n+1 { | DA4 | 3481 | 0D99 | 1101 1001 | 1001 |
| | DA5 | 3729 | 0E91 | 1110 1001 | 0001 |
| | DF6 | 3225 | 0C99 | 1100 1001 | 1001 |
| R6n+1 { | DA6 | 1993 | 07C9 | 0111 1100 | 1001 |
| | DA7 | 2241 | 08C1 | 1000 1100 | 0001 |
| | DF8 | 1243 | 04DB | 0100 1101 | 1011 |
| L6n+2 { | DA8 | 821 | 0335 | 0011 0011 | 0101 |
| | DA9 | 569 | 0239 | 0010 0011 | 1001 |
| | DF10 | 1987 | 07C3 | 0111 1100 | 0011 |
| R6n+2 { | DA10 | 2333 | 091D | 1001 0001 | 1101 |
| | DA11 | 2081 | 0821 | 1000 0010 | 0001 |
| | DF12 | 2729 | 0AA9 | 1010 1010 | 1001 |
| L6n+3 { | DA12 | 2985 | 0BA9 | 1011 1010 | 1001 |
| | DA13 | 3233 | 0CA1 | 1100 1010 | 0001 |
| | DF14 | 3473 | 0D91 | 1101 1001 | 0001 |
| R6n+3 { | DA14 | 1497 | 05D9 | 0101 1101 | 1001 |
| | DA15 | 1745 | 06D1 | 0110 1101 | 0001 |
| | DF16 | 1491 | 05D3 | 0101 1101 | 0011 |
| L6n+4 { | DA16 | 1325 | 052D | 0101 0010 | 1101 |
| | DA17 | 1073 | 0431 | 0100 0011 | 0001 |
| | DF18 | 2235 | 08BB | 1000 1011 | 1011 |
| R6n+4 { | DA18 | 2837 | 0B15 | 1011 0001 | 0101 |
| | DA19 | 2585 | 0A19 | 1010 0001 | 1001 |
| | DF20 | 2977 | 0BA1 | 1011 1010 | 0001 |
| L6n+5 { | DA20 | 2489 | 09B9 | 1001 1011 | 1001 |
| | DA21 | 2737 | 0AB1 | 1010 1011 | 0001 |
| | DF22 | 3721 | 0E89 | 1110 1000 | 1001 |
| R6n+5 { | DA22 | 1001 | 03E9 | 0011 1110 | 1001 |
| | DA23 | 1249 | 04E1 | 0100 1110 | 0001 |

FIG. 20B

| SERIAL NO. | INPUT RB | INPUT TEN | INPUT XCK | OUTPUT(AT) (MSB) | OUTPUT(AT) | OUTPUT(AT) (LSB) |
|---|---|---|---|---|---|---|
| 2780 | 1 | 1 | 0 | 0000 | 0000 | 0000 |
| 2980 | 1 | 1 | 0 | 0000 | 0000 | 0000 |
| 3180 | 1 | 1 | 0 | 0000 | 0000 | 0000 |
| 3380 | 1 | 1 | 1 | 0011 | 1110 | 0011 |
| 3580 | 1 | 1 | 0 | 0011 | 1110 | 0011 |
| 3780 | 1 | 1 | 1 | 0001 | 0011 | 1101 |
| 3980 | 1 | 1 | 0 | 0001 | 0011 | 1101 |
| 4180 | 1 | 1 | 1 | 0000 | 0100 | 0001 |
| 4380 | 1 | 1 | 0 | 0000 | 0100 | 0001 |
| 4580 | 1 | 1 | 1 | 0110 | 1100 | 1011 |
| 4780 | 1 | 1 | 0 | 0110 | 1100 | 1011 |
| 4980 | 1 | 1 | 1 | 0111 | 0010 | 0101 |
| 5180 | 1 | 1 | 0 | 0111 | 0010 | 0101 |
| 5380 | 1 | 1 | 1 | 0110 | 0010 | 1001 |
| 5580 | 1 | 1 | 0 | 0110 | 0010 | 1001 |
| 5780 | 1 | 1 | 1 | 1001 | 1011 | 0001 |
| 5980 | 1 | 1 | 0 | 1001 | 1011 | 0001 |
| 6180 | 1 | 1 | 1 | 1101 | 1001 | 1001 |
| 6380 | 1 | 1 | 0 | 1101 | 1001 | 1001 |
| 6580 | 1 | 1 | 1 | 1110 | 1001 | 0001 |
| 6780 | 1 | 1 | 0 | 1110 | 1001 | 0001 |
| 6980 | 1 | 1 | 1 | 1100 | 1001 | 1001 |
| 7180 | 1 | 1 | 0 | 1100 | 1001 | 1001 |
| 7380 | 1 | 1 | 1 | 0111 | 1100 | 1001 |
| 7580 | 1 | 1 | 0 | 0111 | 1100 | 1001 |
| 7780 | 1 | 1 | 1 | 1000 | 1100 | 0001 |
| 7980 | 1 | 1 | 0 | 1000 | 1100 | 0001 |
| 8180 | 1 | 1 | 1 | 0100 | 1101 | 1011 |
| 8380 | 1 | 1 | 0 | 0100 | 1101 | 1011 |
| 8580 | 1 | 1 | 1 | 0011 | 0011 | 0101 |
| 8780 | 1 | 1 | 0 | 0011 | 0011 | 0101 |
| 8980 | 1 | 1 | 1 | 0010 | 0011 | 1001 |
| 9180 | 1 | 1 | 0 | 0010 | 0011 | 1001 |
| 9380 | 1 | 1 | 1 | 0111 | 1100 | 0011 |
| 9580 | 1 | 1 | 0 | 0111 | 1100 | 0011 |
| 9780 | 1 | 1 | 1 | 1001 | 0001 | 1101 |
| 9980 | 1 | 1 | 0 | 1001 | 0001 | 1101 |
| 10180 | 1 | 1 | 1 | 1000 | 0010 | 0001 |
| 10380 | 1 | 1 | 0 | 1000 | 0010 | 0001 |
| 10580 | 1 | 1 | 1 | 1010 | 1010 | 1001 |
| 10780 | 1 | 1 | 0 | 1010 | 1010 | 1001 |
| 10980 | 1 | 1 | 1 | 1011 | 1010 | 1001 |
| 11180 | 1 | 1 | 0 | 1011 | 1010 | 1001 |
| 11380 | 1 | 1 | 1 | 1100 | 1010 | 0001 |
| 11580 | 1 | 1 | 0 | 1100 | 1010 | 0001 |
| 11780 | 1 | 1 | 1 | 1101 | 1001 | 0001 |
| 11980 | 1 | 1 | 0 | 1101 | 1001 | 0001 |
| 12180 | 1 | 1 | 1 | 1010 | 1101 | 1001 |
| 12380 | 1 | 1 | 0 | 1010 | 1101 | 1001 |
| 12580 | 1 | 1 | 1 | 0110 | 1101 | 0001 |
| 12780 | 1 | 1 | 0 | 0110 | 1101 | 0001 |
| 12980 | 1 | 1 | 1 | 0101 | 1101 | 0011 |
| 13180 | 1 | 1 | 0 | 0101 | 1101 | 0011 |
| 13380 | 1 | 1 | 1 | 0101 | 0010 | 1101 |
| 13580 | 1 | 1 | 0 | 0101 | 0010 | 1101 |
| 13780 | 1 | 1 | 1 | 0100 | 0011 | 0001 |
| 13980 | 1 | 1 | 0 | 0100 | 0011 | 0001 |
| 14180 | 1 | 1 | 1 | 1000 | 1011 | 1011 |
| 14380 | 1 | 1 | 0 | 1000 | 1011 | 1011 |
| 14580 | 1 | 1 | 1 | 1011 | 0001 | 0101 |
| 14780 | 1 | 1 | 0 | 1011 | 0001 | 0101 |
| 14980 | 1 | 1 | 1 | 1010 | 0001 | 1001 |
| 15180 | 1 | 1 | 0 | 1010 | 0001 | 1001 |
| 15380 | 1 | 1 | 1 | 1011 | 1010 | 0001 |
| 15580 | 1 | 1 | 0 | 1011 | 1010 | 0001 |
| 15780 | 1 | 1 | 1 | 1001 | 1011 | 1001 |
| 15980 | 1 | 1 | 0 | 1001 | 1011 | 1001 |
| 16180 | 1 | 1 | 1 | 1010 | 1011 | 0001 |
| 16380 | 1 | 1 | 0 | 1010 | 1011 | 0001 |
| 16580 | 1 | 1 | 1 | 1110 | 1000 | 1001 |
| 16780 | 1 | 1 | 0 | 1110 | 1000 | 1001 |
| 16980 | 1 | 1 | 1 | 0011 | 1110 | 1001 |
| 17180 | 1 | 1 | 0 | 0011 | 1110 | 1001 |
| 17380 | 1 | 1 | 1 | 0100 | 1110 | 0001 |
| 17580 | 1 | 1 | 0 | 0100 | 1110 | 0001 |
| 17780 | 1 | 1 | 1 | 0000 | 0000 | 0000 |
| 17980 | 1 | 1 | 0 | 0000 | 0000 | 0000 |

ADDRESS GENERATOR FOR EFM DECODER EMPLOYING SCRAMBLING COUNTERS

BACKGROUND OF THE INVENTION

1. Field of the Invention

The present invention relates to an address generator in the demodulator of an optical disk system and, more particularly, to an address generator of the memory necessary for detecting and correcting an error in the signal which is recovered from a recording medium and which is eight-to-fourteen modulation (EFM) demodulated, for converting an error corrected digital signal into an analog signal.

Korean Patent Application No. 93-6740 is incorporated herein by reference for all purposes.

2. Discussion of Related Art

As shown in FIG. 1, a demodulator for a conventional optical disk system or compact disc player (a CDP) includes a disk motor 12 for rotating a disk 10, a disk servo 14 for controlling the rotation speed of the disk motor 12, a microcomputer 16 for controlling the disk servo and the overall demodulator, a display 18 for displaying information of the microcomputer 16, a switch 20 for operating the microcomputer 16, an optical pick-up 22 for reading information recorded onto the disk 10, a demodulator 24 for EFM demodulating the output signal of the optical pick-up 22, thus restoring the demodulated signal into original data symbols and then supplying the restored signal to the disk servo 14 and the microcomputer 16, a RAM 30 for storing the output signal of the demodulator 24, an error correction coder (ECC) 28 for reading the EFM demodulated signal stored in the RAM 30, performing error detection and correction and again storing the corrected data in RAM 30, a digital-to-analog (D/A) convertor 34 for reading the EFM demodulated signal which is stored in RAM 30, whose error has been corrected, and then converting it into an analog signal, an address generator 32 for generating a recording address of the EFM demodulated signal, a reading address of the EFM demodulated signal for error detection and correction, a recording address for storing the result of the error correction, and a reading address for converting the error-corrected EFM demodulated signal into analog form, and a low-pass filter 36 for eliminating the noise of the output signal of the D/A convertor 34 and outputting the signal as two channels L and R.

FIG. 2 is a systematic diagram of the encoder implementing a circular interleave Reed-Solomon code (CIRC) method used in the modulator of a conventional CDP, wherein the modulated data consists of two sets of six samples each, e.g., L and R channels, making twelve samples of an audio signal expressed as sixteen bits forming a sampling unit. Each of the sixteen bits of data is divided into upper and lower eight bits. Each of these eight bits of data is treated as one symbol (or word), e.g., twelve samples form 24 symbols.

A cross-over time delay 40 delays the data of the even samplings from the leading symbol of the 24 symbols by two symbols, crosses the 24 symbols and arranges the data symbols so that it is separated by a predetermined interval. The thus-crossed 24 data symbols are supplied to a C2 encoder 42, which forms a first error correction code C2 from the 24 data symbols where C2 denotes a Reed-Solomon code whose redundancy is four (where n equals 28 and k equals 24, and the minimum distance is five). Here, the parity of code C2 is represented by Q. A first check symbol row, i.e., four symbols of Q parity, is located in the middle of the 24 data symbols.

An interleaver 44 differentially delays and interleaves 24 symbols with four data symbols of Q parity, each by a different amount, thus creating 28 symbols in total. The differential delay operation is performed starting from the second symbol, i.e., excludes the first symbol, which results in the sequential delay amounts of 1D, 2D, 3D ..., and 27D. Here, the primary unit D corresponds to a predetermined delay amount of four symbols.

A C1 encoder 46 forms a second error correction code C1 from the 28 data symbols differentially delayed by interleaver 44. C1 denotes a Reed-Solomon code whose redundancy is four (where n equals 32 and k equals 28, and whose minimum distance is five). It will be noted that the parity of C1 is represented by P. A second check symbol row, i.e., four symbols of P parity, is arranged next to last symbol among the 28 symbols.

A scrambler 48 delays the odd numbered time data symbols among the 28 symbols and four data symbols of P parity by one symbol, and generates all 32 data symbols, to thereby complete an encoding operation.

FIG. 3 is a systematic diagram of the corresponding decoder for implementing the CIRC method used in ECC 28 (CIRC) shown in FIG. 1. With respect to the 32 data symbols encoded by the CIRC method encoder shown in FIG. 2, the data symbols are processed in the reverse of the encoding order and, at the same time, the error detected by P and Q parities is corrected to thereby restore the original data symbols.

Referring to FIG. 3, 32 data symbols expressed in terms of W, P and Q, i.e., data rows, are recovered from the optical disk and demodulated. Here, the 24 data symbols expressed in terms of W, i.e., data symbol rows, represents audio data, and the data expressed in terms of P and Q, i.e., the first and second check symbol rows, contain parity data for detecting and correcting errors. The 32 data symbols are supplied to a descrambler 50, which delays the even numbered time data symbols from the leading data by one symbol in order to undo the scrambling of the scrambled 32 data symbols.

Since the magnitude of the groove formed on an optical disk in a CDP can be expressed as eight bits or less, an 8-bit signal processing unit is used, with the eight bits being treated as one symbol. Thus, the errors due to the groove of the optical disk exist largely as one symbol units. However, if there is a fault between symbols, an error of two symbols may be generated. Therefore, in order to scatter the occurrence of such a successive error, a delay of one symbol unit is performed, which is called scramble processing. At the time of reproduction, in order to undo the scrambling, a descramble processing is performed. It should be noted that the logic states of the four data symbols of Q and P parities are inverted by eight inverters.

A C1 decoder 52 detects burst errors in the residual 28 data symbols by way of four data symbols of P parity among the 32 data symbols and corrects some of the random errors at the same time. The error correction generates four syndromes by a parity check matrix, i.e., a Reed-Solomon code, each having the ability to correct only one symbol. If two or more symbol errors are generated, the data block is determined as having an uncorrectable error and the 28 symbols are transmitted to the next stage without being corrected. Here, pointers or flags (of at least one bit) are assigned to every symbol of all the data rows so as to indicate the presence or absence of an error.

A deinterleaver 54 differentially delays 28 data symbols transmitted from the C1 decoder 52 and thereby reverses the interleaving operation discussed above. In other words, since the errors generated during the reproduction of an optical disk are mostly due to scratches, dust or dirt, once an error is generated, several adjacent symbols are damaged at the same time. If many symbols are damaged within the same data block, error detection or correction becomes impossible. Therefore, at the time of recording, the symbols within one data block are separated and recorded in different data blocks. Then, at the time of reproduction, the separated symbols are restored to their original data block position, which is called deinter-leaving.

A C2 decoder 56 generates four syndromes from the Reed-Solomon code and input 28 symbols of data by using four data symbols of Q parity among the 28 data symbols restored into the original data block position after the interleaving is undone. Here, the 28 symbols are all delayed by the same delay time of 27D. It should be noted that C2 decoder 56 corrects a maximum of four symbol errors.

An inverse cross-over time delay 58 crosses over 24 data symbols supplied from the C2 decoder 56 with one another in order to restore them to the original data block position and delays two-symbols of undelayed data symbols by a two-symbol period in order to restore the symbol adjacent data with respect to a time axis, which were previously separated by a two-symbol delay process at the time of encoding, to the original position. Such a delay serves to prevent the output of uncorrectable error data continuously at the time of reproduction.

FIG. 4 is a block diagram of a conventional address generator 32 shown in FIG. 1, wherein an EFM counter 60 counts the counter pulse of the EFM data output from the microcomputer 16 and thereby generates a symbol address of the EFM demodulated signal. An EFM ROM 63 is a memory, which is addressed by EFM counter 60, for pre-storing the symbol address of the EFM demodulated signal. An ECC counter 61 counts the counter pulses of the C1 and C2 data and the C1 and C2 flags output from ECC 28 (of FIG. 1), and thereby generates symbol addresses for each of the C1 and C2 data and flags, respectively. ECC ROM1 64, ECC ROM2 65, ECC ROM3 66 and ECC ROM4 67 are memories, which are addressed by the ECC counter 61, for pre-storing each symbol address or flag address for the C1 and C2 data and flags, respectively. A D/A converter (DAC) counter 62 counts the counter pulses of the data output from the microcomputer 16 and thereby generates the symbol address or flag address of the output data. DAC ROM 68, which is a memory addressed by the D/A converter counter 62, pre-stores the symbol address or flag address of the output data. A multiplexer 69 selectively outputs one from among the symbol addresses of EFM ROM 63, ECC ROM1 64, ECC ROM2 65, ECC ROM3 66, ECC ROM4 67 and DAC ROM 68 to an adder 71, which also receives a frame address of one frame unit from base counter 70. Adder 71 adds the symbol address or flag address output from the multiplexer 69 and the frame address output from the base counter 70 and then supplies the result as a final address. RAM 72 stores a signal according to the final address output from the adder 71.

However, since the aforementioned conventional address generator calculates the memory address of each data symbol by using a large amount of ROM memory, e.g., by the look-up table method, chip size is increased. Thus, the overall reliability of the chips is reduced and the signal processing speed is also lowered.

SUMMARY OF THE INVENTION

Therefore, in order to solve the aforementioned problems, the principal object of the present invention is to provide an address generator for generating the address used in addressing a memory storing a demodulated signal by using a scrambling counter and a decoder instead of a ROM and a counter for addressing the ROM.

Another object of the present invention is to provide an address generator for generating the address for addressing a memory necessary for error detection and correction of a demodulated signal by using a scrambling counter and a decoder instead of a ROM and a counter for addressing the associated ROM.

Still another object of the present invention is to provide an address generator for generating the address for a memory used in converting a digital signal, whose error has already been detected and corrected, into an analog signal using a scrambling counter and a decoder instead of a ROM and a corresponding counter for addressing the ROM.

Yet another object of the present invention is to provide an address generator for generating the address for a memory storing demodulated signals, the address for a memory associated with error detection and correction of the demodulated signals, and the address for a memory associated with conversion of a digital signal, whose error has been detected and corrected, into an analog signal using a random counter and a decoder instead of a ROM and corresponding counter for addressing that ROM.

These and other objects, features, and advantages according to the present invention are provided by an address generator for generating addresses for addressing a memory necessary for dividing a plurality of data symbols and parity symbols, which belong to the same frame, after demodulation, in a predetermined manner, into respective symbols, and then for storing them within a predetermined area of the memory. The address generator advantageously includes:

a first counter for sequentially generating predetermined addresses respectively corresponding to the data symbols and parity symbols which belong to the same frame, while circulating by a predetermined period of one frame;

a second counter for generating frame addresses which differentiate the position of the respective symbols belonging to another frame within the memory, when the respective symbols or flags are read from the memory; and an adder for adding the symbol address output from the first counter and the frame address output from the second counter and then providing the resultant sum to the memory.

These and other objects, features and advantages according to the present invention are provided by an address generator for generating addresses associated with the addressing of a memory necessary for error detection and correction using two series encoding words C1 and C2 which are stored in the memory, each in a predetermined order and each including a plurality of data symbols and parity symbols. The address generator preferably includes:

a first counter for synchronizing in a first predetermined order the symbol addresses respectively corresponding to the data symbols and parity symbols which belong to a first series encoding word C1 with the error detection and correction process of the first series encoding word C1 to thereby sequentially output synchronized symbol addresses;

a second counter for synchronizing in a second predetermined order the symbol addresses respectively corresponding to the plurality of data symbols and parity symbols which belong to a second series encoding word C2 with the error detection and correction process of the second series encoding word C2 to thereby sequentially output the synchronized symbol addresses;

a third counter for generating third addresses respectively corresponding to flags C1P for indicating whether the errors of respective symbols for the first series encoding word C1 are corrected;

a fourth counter for generating fourth addresses respectively corresponding to flags C2P for indicating whether the errors of the respective symbols for the second series encoding word C2 are corrected;

selective output means for selectively providing only one among the outputs from the first, second, third and fourth counters;

a fifth counter for generating frame addresses for differentiating the positions of the respective symbols or flags which belong to another frame within the memory, when the respective symbols or flags are recorded to or read from the memory; and an adder for adding the addresses output from the selective output means and the frame addresses output from the fifth counter and then providing the resultant sum to the memory.

These and other objects, features and advantages according to the present invention are provided by an address generator for generating the addresses for addressing a memory necessary for converting the data symbols of digital signals, whose errors are first corrected and then stored in the memory in a predetermined order, into analog signals. Preferably, the address generator includes:

a first counter for sequentially providing the symbol addresses or flag addresses in a predetermined order respectively corresponding to the data symbols or flags with respect to the error correction of the respective data symbols;

a second counter for generating the frame addresses which differentiate the positions of the respective symbols or flags which belong to another frame within the memory, when the symbols or flags are read from the memory; and an adder for adding the symbol addresses or flag addresses output from the first counter and the frame addresses output from the second counter and then providing the resultant sum to the memory.

These and other objects, features and advantages according to the present invention, are provided by an address generator including:

a first counter for sequentially generating predetermined addresses respectively corresponding to a plurality of data symbols and parity symbols which belong to the same frame while circulating in a period of one frame so that the plurality of data symbols and parity symbols which belong to one frame, demodulated within a predetermined area of the memory in a predetermined manner, are divided into the respective symbols and stored;

a plurality of second counters for generating addresses for addressing a memory necessary for recording or reading first flags corresponding to each symbol of an encoding word C1 and second flags corresponding to each symbol of an encoding word C2, with respect to the error correction of the data symbols, or generating the symbol addresses of the data symbols or parity symbols which belong to two series encoding words C1 and C2, in order to detect and correct the error, by using the two series encoding words C1 and C2, stored in the memory respectively in a predetermined order;

a third counter for sequentially providing in a predetermined order symbol addresses or flag addresses respectively corresponding to the data symbols and second flags corresponding to the respective symbols of the encoding word C2 with respect to the error correction of the respective data symbols, in order to convert the data symbols of digital signals, whose errors are corrected and then stored in the memory, into analog signals;

selective output means connected to each output terminal of the first counter, the second counters and the third counter, for selectively providing one out of all addresses respectively output from the first counter, the second counters and the third counter;

a fourth counter for generating frame addresses for differentiating positions of the respective symbols and flags which belong to another frame within the memory when the respective symbols or flags are recorded to or read from the memory; and an adder for adding the symbol addresses or flag addresses output from the selective output means and the frame addresses output from the fourth counter and then providing a resultant sum to the memory.

BRIEF DESCRIPTION OF THE DRAWINGS

The above objects and advantages of the present invention will become more apparent by describing in detail a preferred embodiments thereof with reference to the attached drawings in which like elements are denoted throughout by like or similar numbers and in which:

FIGS. 5A and 5B show address mappings by the address generator according to the present invention for the exemplary case of a 32K static random access memory (SRAM);

FIGS. 10A and 10B are tables showing the relationship between the input and the output of the EFM counter shown in FIG. 9;

FIG. 12 is a table showing the relationship between the input and the output of the C1 decoder counter shown in FIG. 11;

FIG. 14 is a table showing the relationship between the input and the output of the C2 decoder counter shown in FIG. 13;

FIG. 16 is a table showing the relationship between the input and the output of the C1P decoder counter shown in FIG. 15;

FIG. 18 is a table showing the relationship between the input and the output of the C2P decoder counter shown in FIG. 17;

FIGS. 20A and 20B are tables showing the relationship between the input and the output of the DAC counter shown collectively in FIGS. 19A, 19B and 19C;

DETAILED DESCRIPTION OF THE PREFERRED EMBODIMENT

Figure 1:
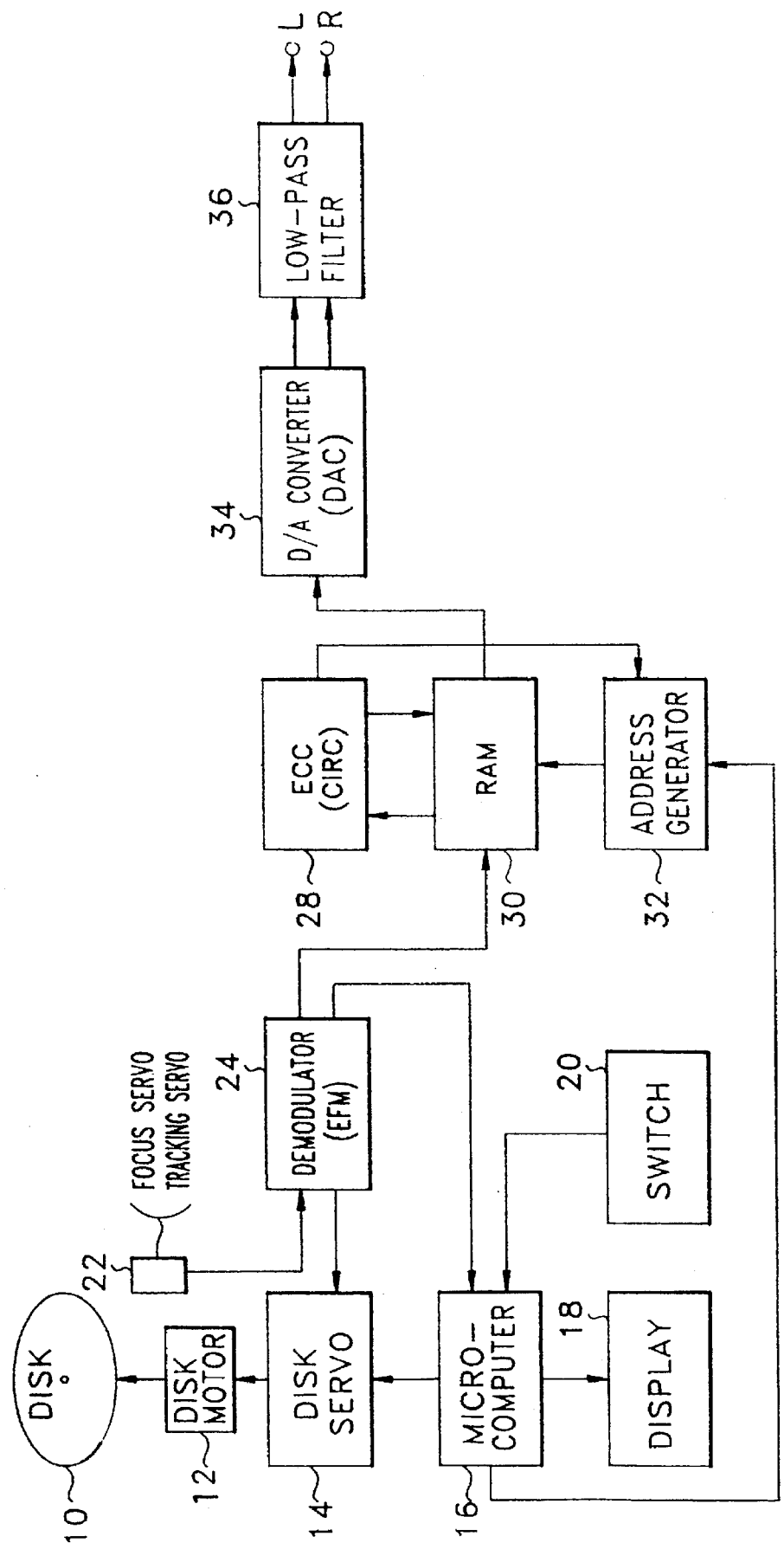
FIG. 1 is a block diagram of the demodulator for a general CDP.
Figure 2:
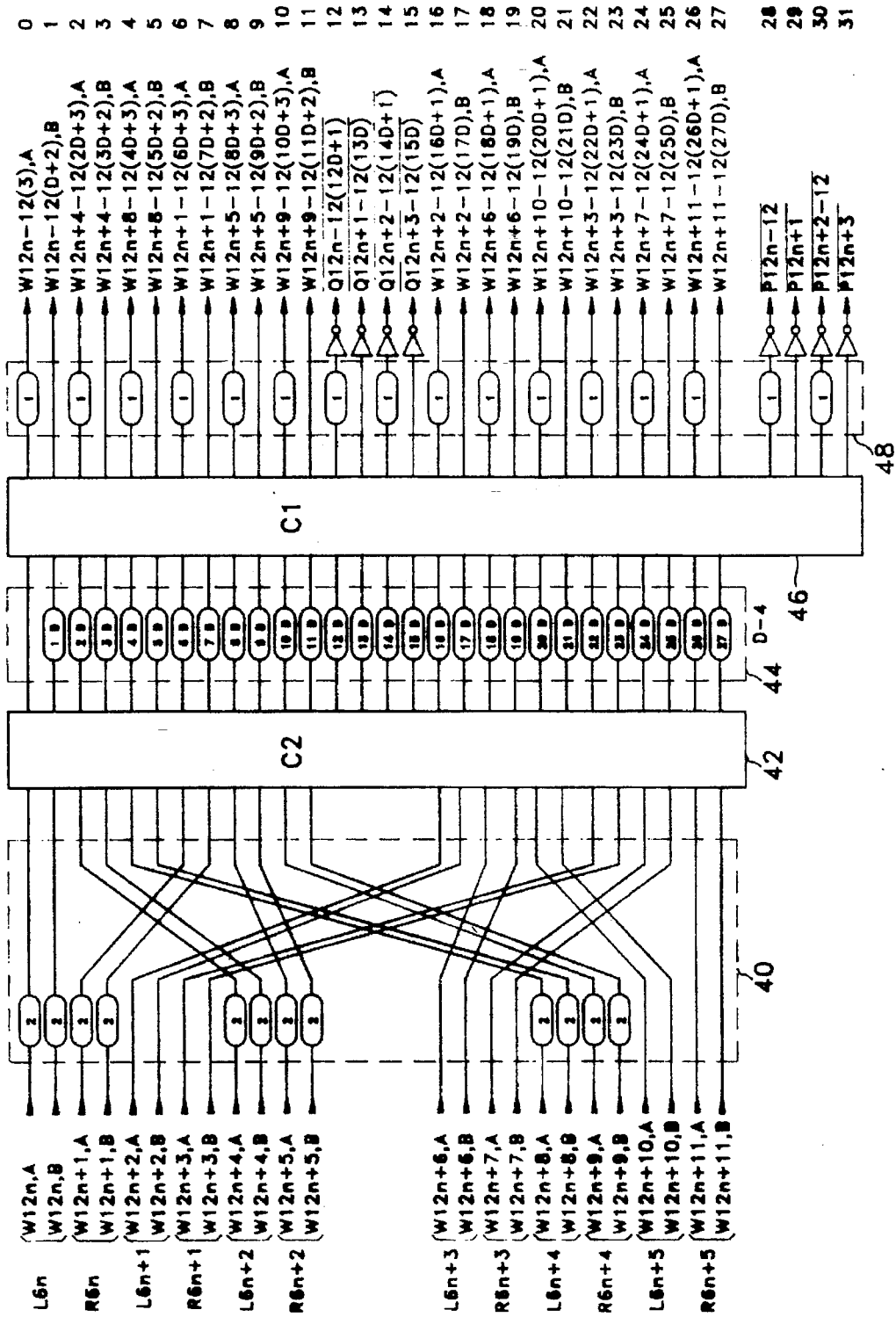
FIG. 2 is a systematic diagram of the encoder operating according to a CIRC method used in the modulator for a general CDP.
Figure 3:
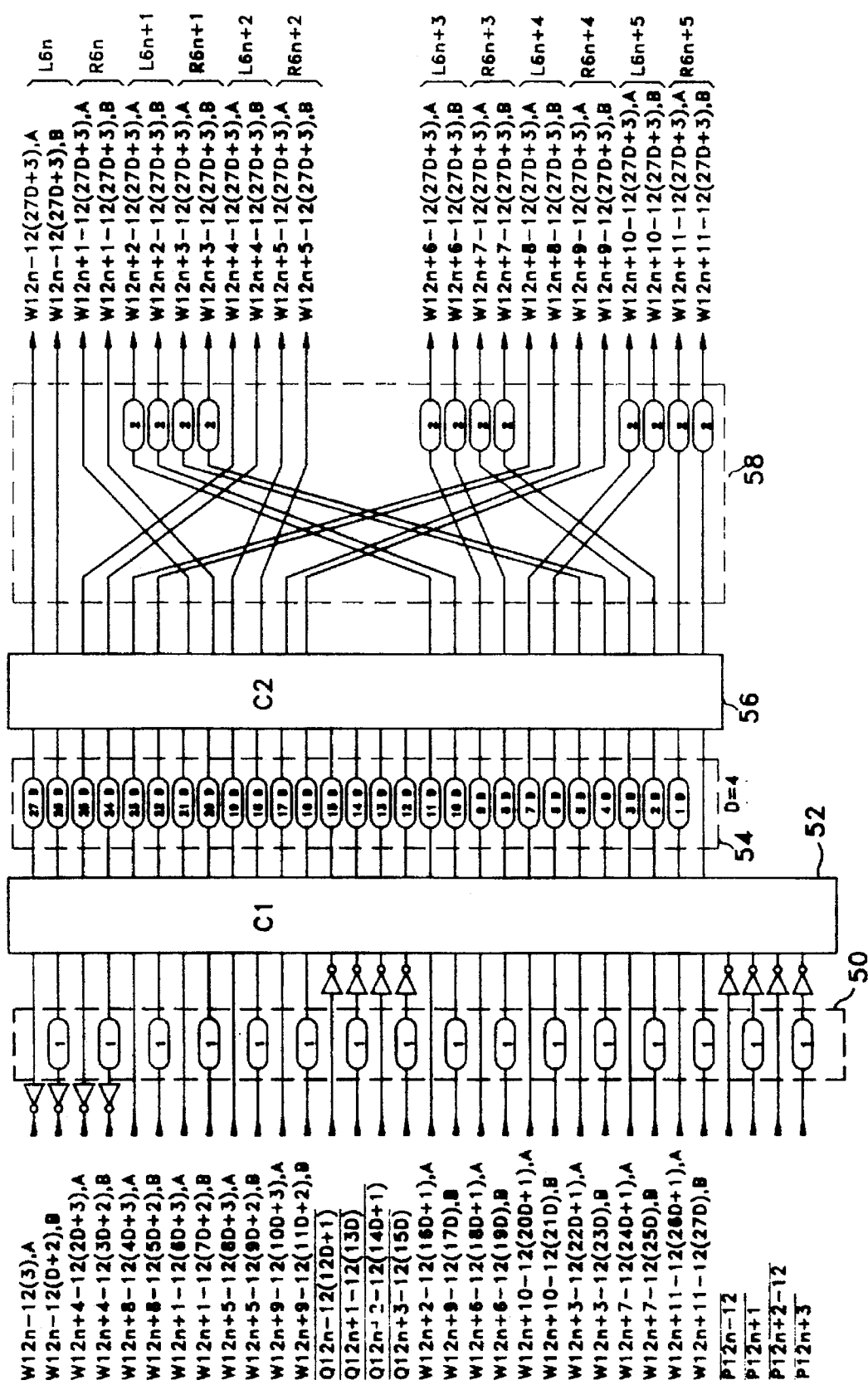
FIG. 3 is a systematic diagram of the decoder operating according to a CIRC method used in the ECC shown in FIG. 1.
Figure 4:
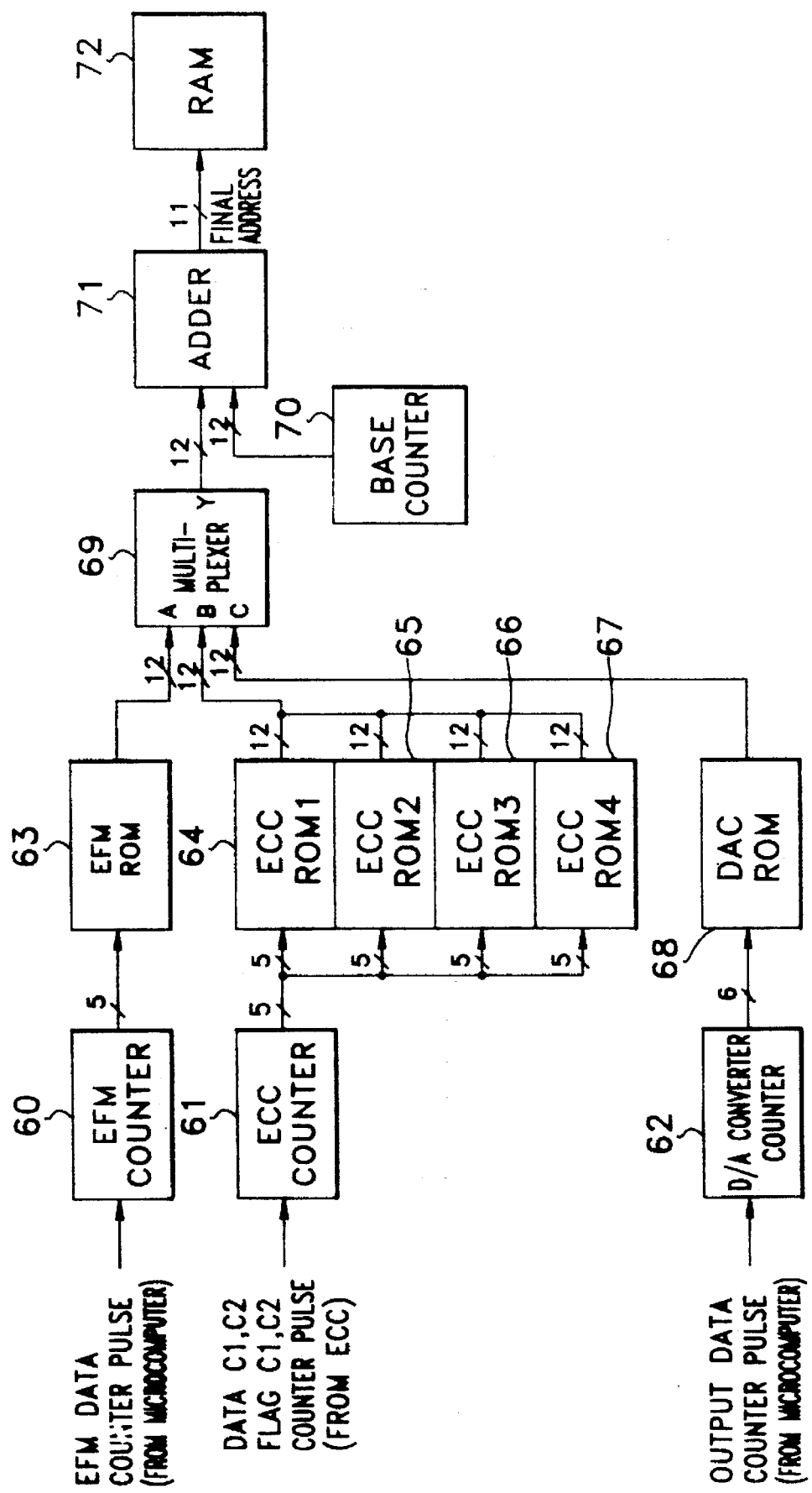
FIG. 4 is a block diagram of the conventional address generator shown in FIG. 1.
Figure 5B:
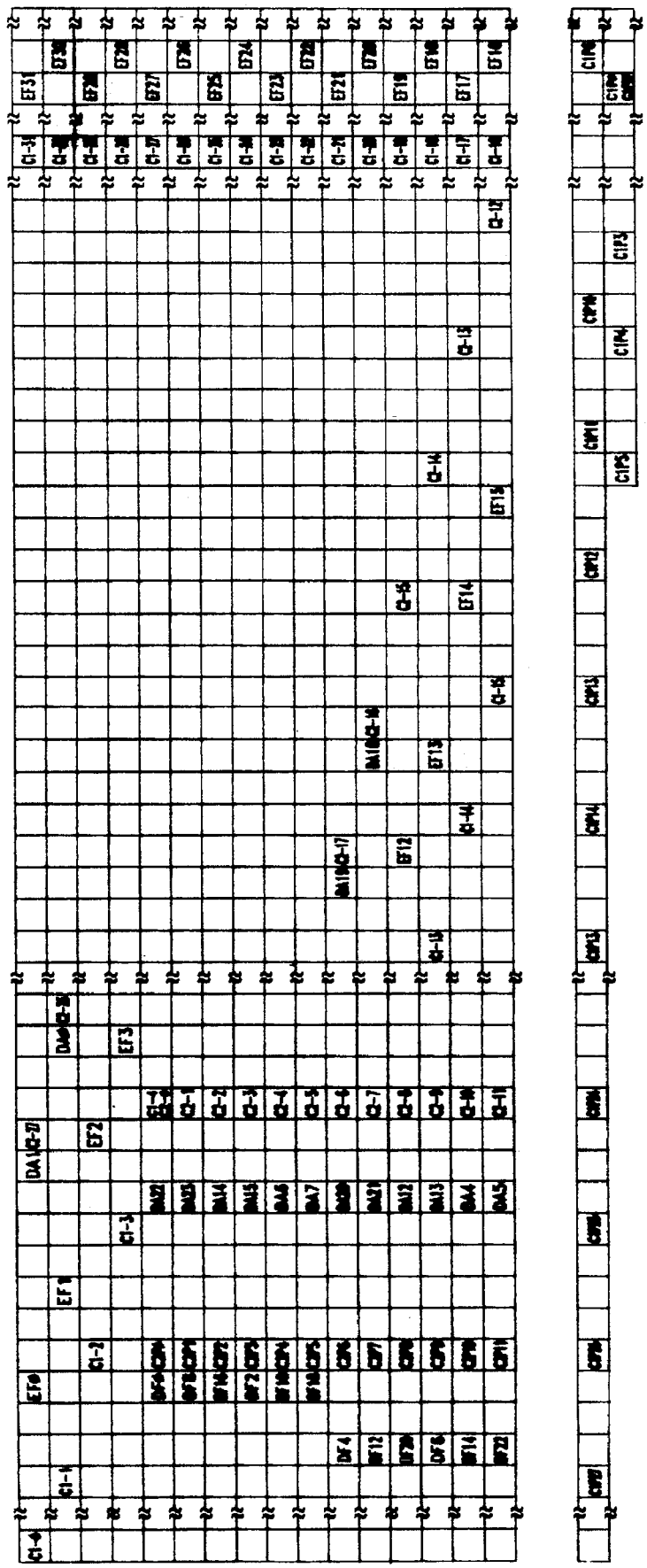
Figure 6:
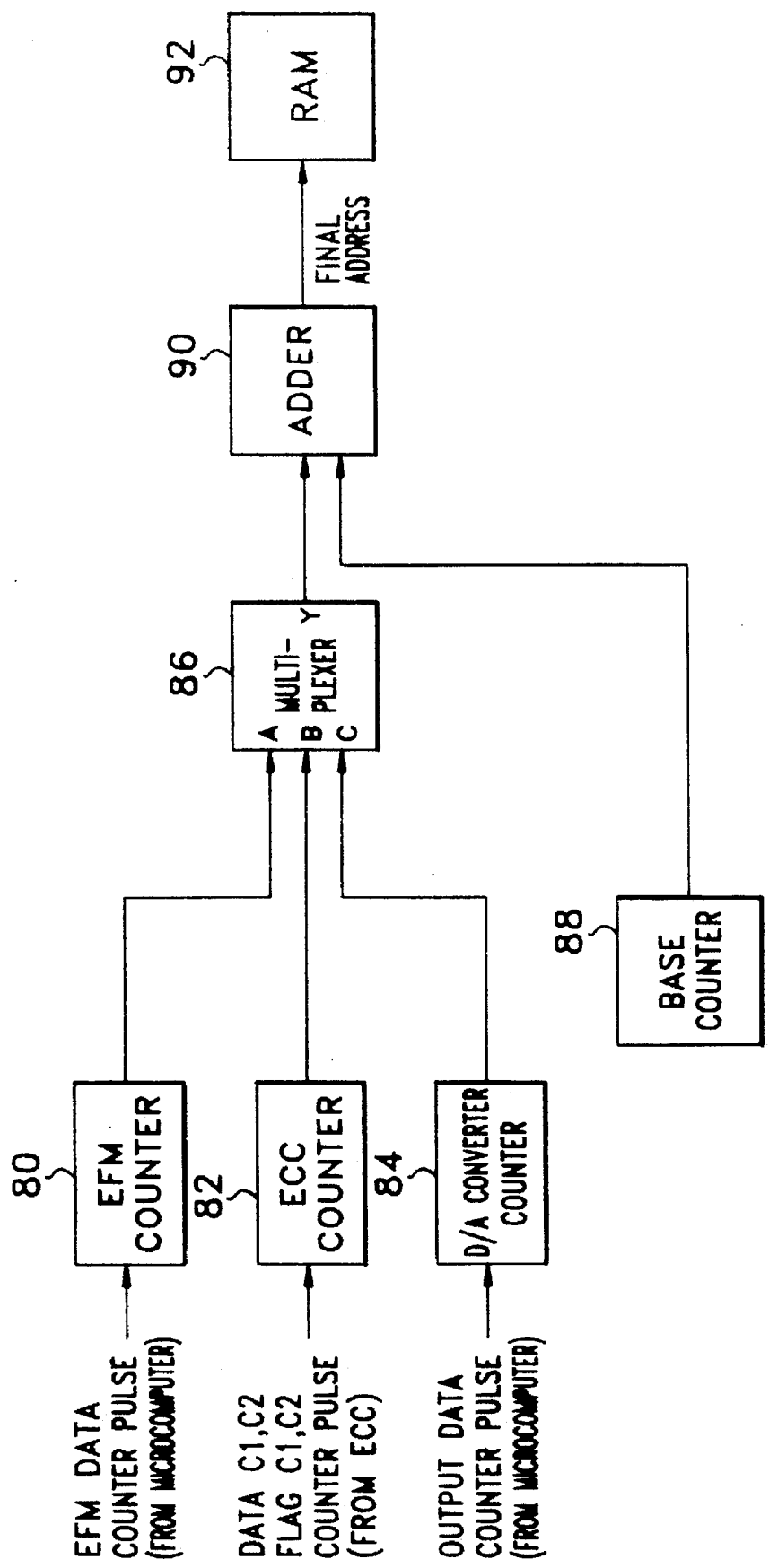
FIG. 6 is a block diagram of the address generator according to the present invention which may be used in the CDP shown in FIG. 23.
Figure 7:
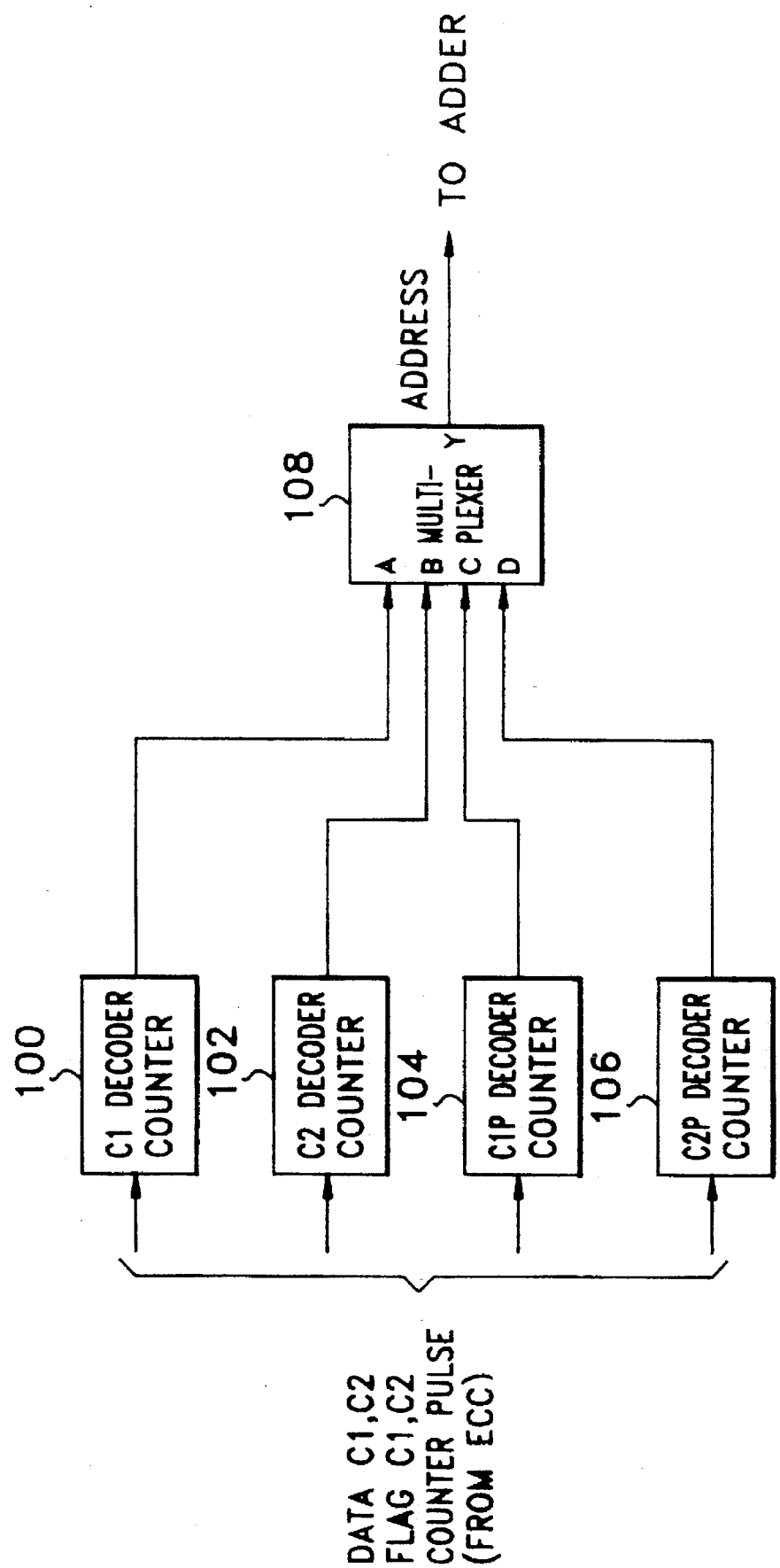
FIG. 7 is a detailed block diagram of the ECC counter shown in FIG. 6.

The binary and decimal numbers in FIG. 5A respectively represent input and output states of the addresses corresponding to 32 data symbols outputs from the EFM counter 80, the addresses corresponding to 36 data symbols outputs from the DAC counter 84 as shown in FIG. 6, and the addresses corresponding to the input and output 32 symbols of the C1 decoder counter 100, the addresses corresponding to the input and output 28 symbols of the C2 decoder counter 102, the addresses corresponding to the input and output 28 symbols of the C1P decoder counter 104, and the addresses corresponding to the input and output 12 symbols of the C2P decoder counter 106, as shown in FIG. 7.

FIG. 5B shows the actual positions of the respective addresses in a 32K SRAM memory. Preferably, EF31 to EF0 are addresses corresponding to 32 data symbols output from the EFM counter 80, C1-31 to C1-0 are addresses corresponding to 32 data symbols output from the C1 decoder counter 100, C2-27 to C2-0 are addresses corresponding to 28 data symbols output from the C2 decoder counter 102, C1P27 to C1P0 are addresses corresponding to 28 data symbols output from the C1P decoder counter 104, C2P0 to C2P11 are addresses corresponding to 12 data symbols output from the C2P decoder counter 106, and DA0 to DA23 and DF0 to DF22 are addresses corresponding to 36 data symbols output from the DAC counter 84.

Figure 23:
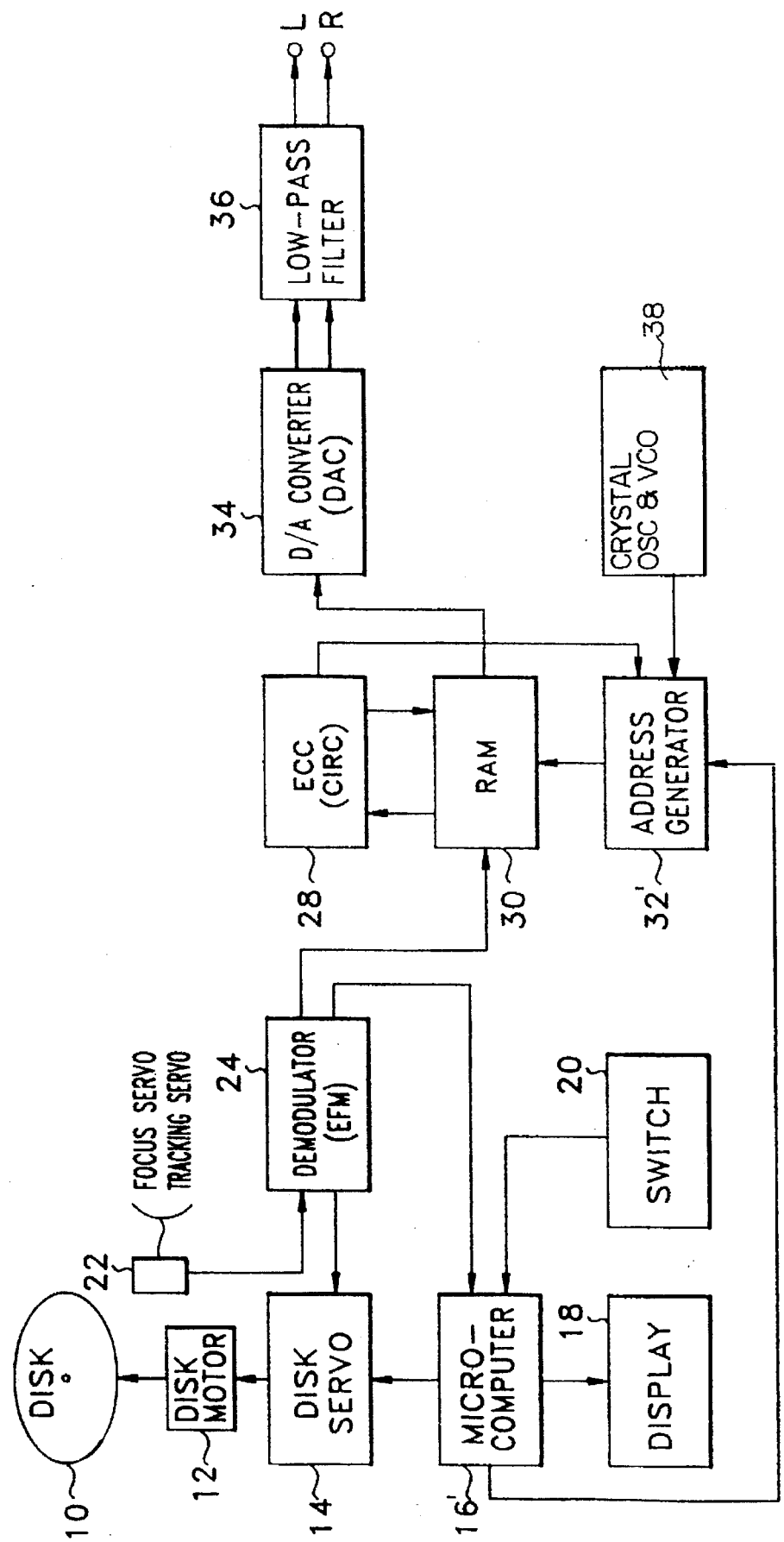
FIG. 23 is a high level block diagram of a CDP according to a preferred embodiment of the present invention.

FIG. 6 is a block diagram of the address generator advantageously employed in the embodiment of the present invention shown in FIG. 23.

The address generator shown in FIG. 6 includes an EFM counter 80 to which the counter pulse of the EFM data output from the microcomputer 16' is input, an ECC counter 82 to which the counter pulse of the C1 and C2 data and the C1 and C2 flags output from ECC 28 are input, a DAC counter 84 to which the counter pulse of the output data output from the microcomputer 16' is input, a multiplexer 86 for selectively providing one out of all of the addresses respectively output from the EFM counter 80, ECC counter 82 and DAC counter 84, a base counter 88 for generating a frame address, an adder 90 to which the selected address output by multiplexer 86 and the address output from base counter 88 are input, and a memory 92, i.e., RAM 92, which is addressed according to the address output from the adder 90. It should be noted that EFM counter 80, ECC counter 82 and DAC counter 84 advantageously are scrambling counters.

The operation according to the above-described configuration will now be presented. First, the EFM counter 80 outputs predetermined addresses EF31 to EF0 respectively corresponding to a plurality of data symbols and parity symbols belonging to the same frame so that the data symbols and parity symbols demodulated in a predetermined manner and belonging to the same frame are divided into the respective symbols and thereby stored within a predetermined area of RAM 92. In other words, the EFM counter 80 sequentially outputs, in a predetermined order such as that shown in the memory map of FIG. 5B, the addresses generated by counting the EFM data counter pulse output from the microcomputer 16'.

The ECC counter 82 generates the symbol addresses, C1-31 to C1-0 and C2-27 to C2-0, of the data symbols or parity symbols belonging to encoding words C1 and C2, for error detection and correction using the encoding words C1 and C2 including the data symbols and parity symbols stored in RAM 92 in a predetermined order. The ECC counter 82 advantageously generates the addresses C1P27 to C1P0 and C2P0 to C2P11 used in addressing a memory for recording or reading flags with respect to the error correction of data symbols. In other words, the ECC counter 82 generates the addresses generated by counting the counter pulses of the data C1 and C2 and flags C1 and C2 output from ECC 28 in a predetermined order, such as that shown in the memory map of FIG. 5B. Preferably, the flags include a first flag corresponding to each symbol of the encoding word C1 and a second flag corresponding to each symbol of the encoding word C2.

DAC counter 84 advantageously outputs symbol addresses DA0 to DA23 or flag addresses DF0 to DF22, respectively corresponding to the data symbols or second flags corresponding to associated symbols of the encoding word C2 with respect to the error correction of the respective data symbols, in order to convert the data symbols representing digital signals, whose errors are corrected and stored in RAM 92 in a predetermined order, into analog signals. In other words, the DAC counter 84 sequentially outputs addresses generated by counting the counter pulse of the output data generated by the microcomputer 16' in a predetermined order such as that shown in the memory map of FIG. 5B.

Multiplexer 86 is preferably connected with each output terminal of the EFM counter 80, ECC counter 82 and DAC counter 84 and selectively outputs one of the three addresses generated by these devices.

Base counter 88 generates the frame address for differentiating positions of the respective symbols or flags belonging to another frame within the RAM 92, when the respective symbols or flags are recorded to or read from RAM 92.

The adder 90 adds the symbol address or flag address output from the multiplexer 86 and the frame address output from the base counter 88 and provides the result to the RAM 92 as a final address. RAM 92 stores the signal according to the final address output from the adder 90.

FIG. 7 is a detailed block diagram of the ECC counter 82 shown in FIG. 6, which includes a C1 decoder counter 100, a C2 decoder counter 102, a C1P decoder counter 104 and a C2P decoder counter 106 to which the counter pulses of C1 and C2 data and C1 and C2 flags, respectively output from the ECC 28 are input, and a multiplexer 108 for selecting only one out of all of the outputs of the C1 decoder counter 100, the C2 decoder counter 102, the C1P decoder counter 104 and the C2P decoder counter 106 and providing the selected output to adder 90 of FIG. 6. The operation according to the above configuration will next be described.

First, the C1 decoder counter 100 synchronizes the symbol addresses C1-31 to C1-0, respectively corresponding to a plurality of data symbols and parity symbols and belonging to the first series encoding word C1 in a predetermined order with the error detection and correction process of the first series encoding word C1, and thereby sequentially outputs them as shown in the memory map of FIG. 5B.

The C2 decoder counter 102 synchronizes symbol addresses C2-27 to C2-0, respectively corresponding to data symbols and parity symbols and belonging to the second series encoding word C2 in a predetermined order with the error detection and correction process of the second series encoding word C2, and thereby sequentially outputs them as shown in the memory map of FIG. 5B.

The C1P decoder counter 104 generates addresses C1P27 to C1P0 for addressing RAM 92 for the flags C1P for indicating whether the errors of the respective symbols of the first series encoding word C1 are corrected, and outputs them in the sequence shown by the memory map of FIG. 5B.

The C2P decoder counter 106 generates addresses C2P0 to C2P11 for addressing RAM 92 for the flags C2P used in indicating whether the errors of the respective symbols of the second series encoding word C2 are corrected, and outputs them in the sequence shown by the memory map of FIG. 5B.

The multiplexer 108 selects one among all of the output addresses of the C1 decoder counter 100, the C2 decoder counter 102, the C1P decoder counter 104 and the C2P decoder counter 106, and outputs the selected output to the adder 90.

Figure 8:
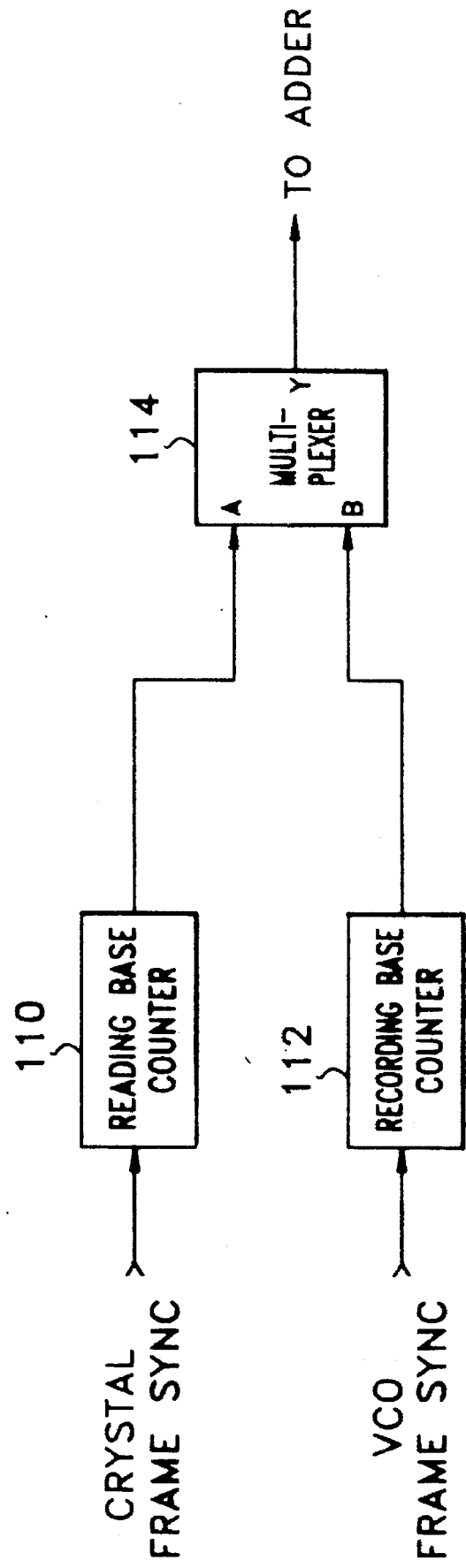
FIG. 8 is a detailed block diagram of the base counter shown in FIG. 6.

FIG. 8 is a detailed block diagram of the base counter 88 shown in FIG. 6, which includes a reading base counter 110 to which a frame synchronization signal generated by a crystal oscillator (connected as shown in FIG. 23) is input, a recording base counter 112 to which a frame synchronization signal generated by a voltage-controlled oscillator (VCO; included in block 38 of FIG. 23) is input, and a multiplexer 114 for selecting one of the output addresses of the reading base counter 110 and recording base counter 112 and providing the selected output to adder 90 of FIG. 6. The operation of the above configuration will now be described.

Figure 21:
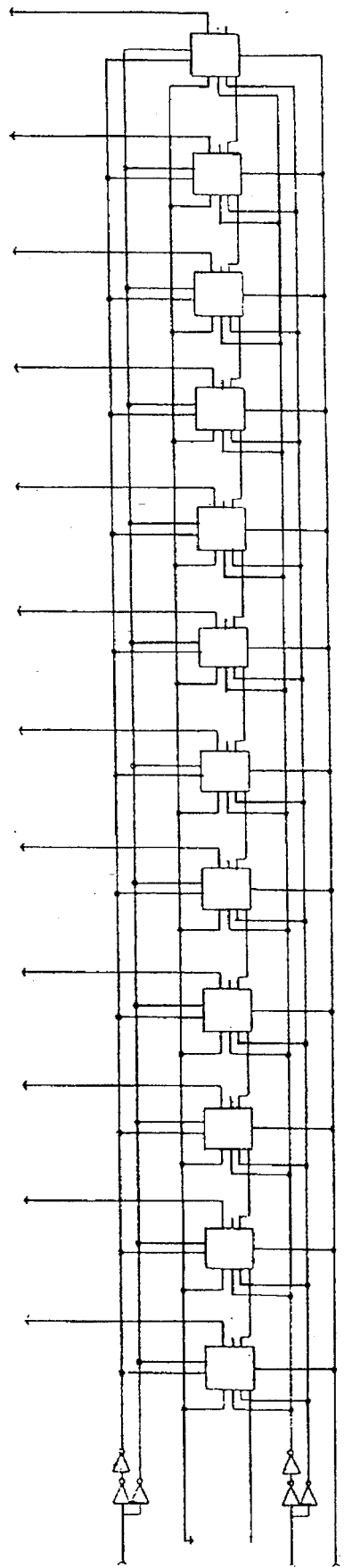
FIG. 21 is a detailed circuit diagram of the reading base counter shown in FIG. 8.

First, the reading base counter 110 counts the 7.35 KHz clock signals of the two channels L and R, whose frequency is derived from the crystal oscillator, and then generates a frame address for differentiating the positions of the respective symbols belonging to another frame within RAM 92, when the respective symbols or flags are read from that memory device. An exemplary detailed circuit diagram of reading base counter 110 is shown in FIG. 21.

Figure 22:
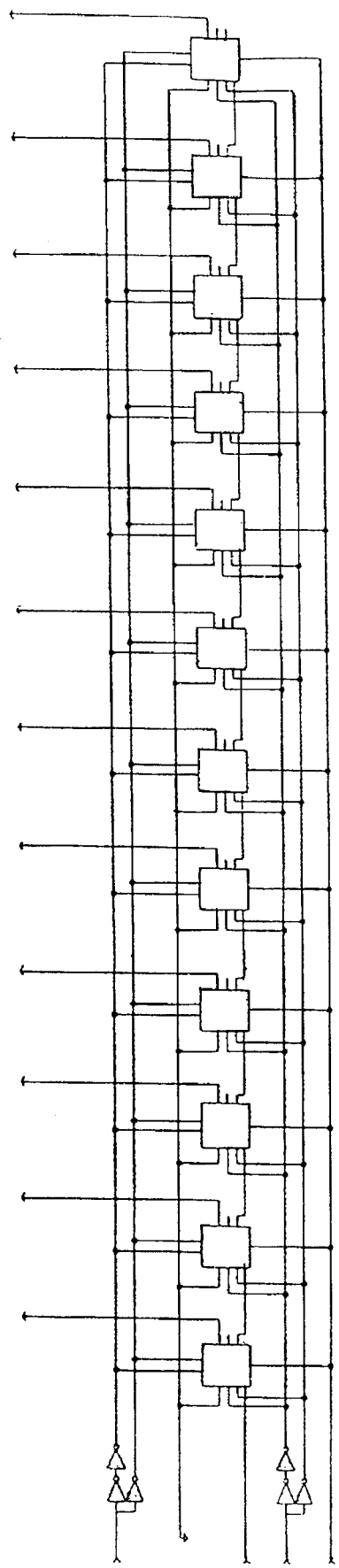
FIG. 22 is a detailed circuit diagram of the recording base counter shown in FIG. 8.

The recording base counter 112 counts the frame synchronization signal generated by the VCO and then generates a frame address for differentiating the positions of the respective symbols belonging to another frame within RAM 92, i.e., when the respective symbols or flags are recorded on to that memory. An exemplary detailed circuit diagram of recording base counter 112 is shown in FIG. 22.

Multiplexer 114 selects one of the frame addresses output from the reading base counter 110 and recording base counter 112 and outputs the selected address to adder 90 shown in FIG. 6.

Figure 9:
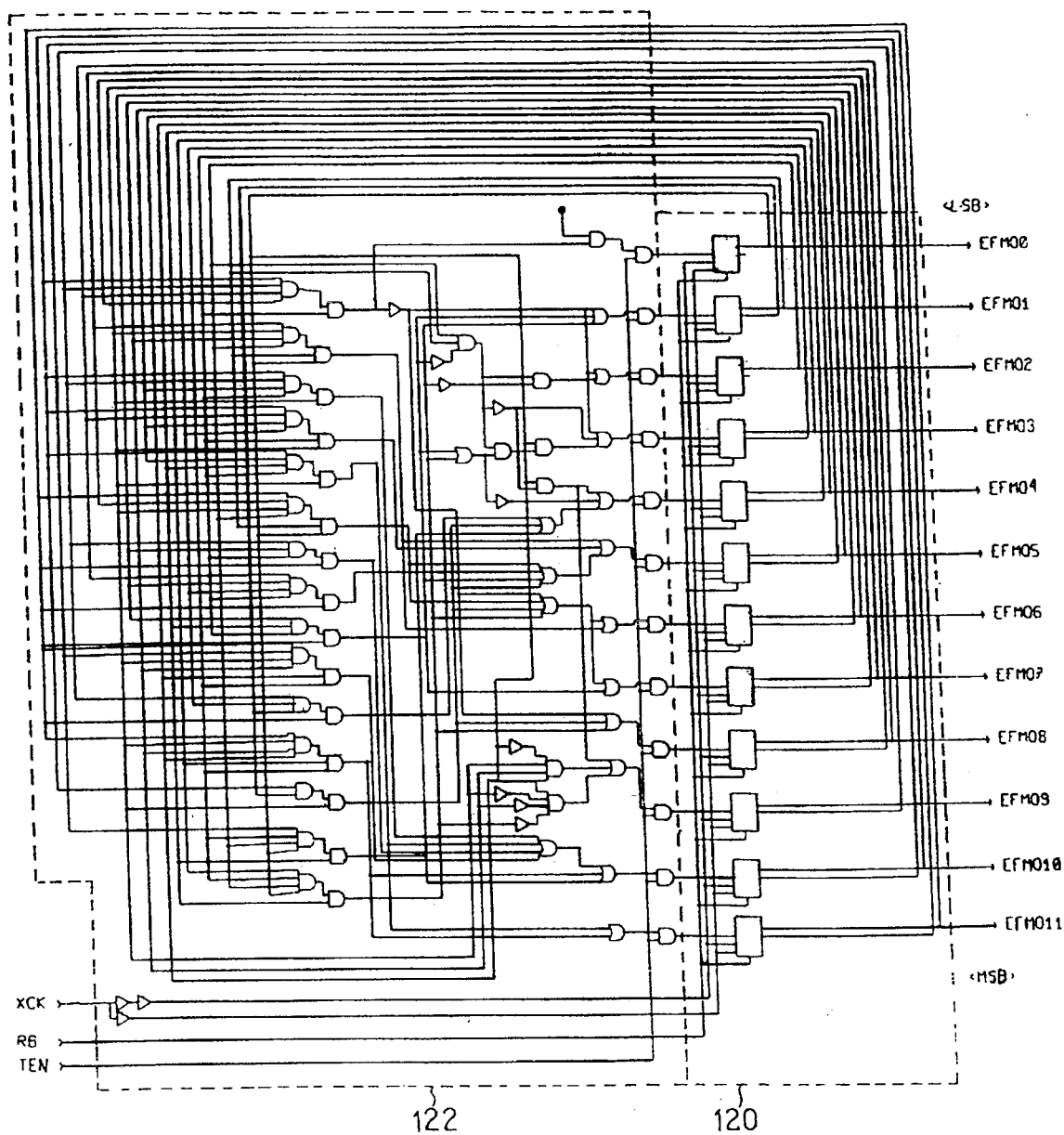
FIG. 9 is a detailed circuit diagram of the EFM counter shown in FIG. 6.

FIG. 9 is a detailed circuit diagram of the EFM counter 80, which includes an address output unit 120 for generating a symbol address of an EFM demodulated signal, and an enabling signal generator 122 for controlling the address output unit 120. The operation according to the above configuration is as follows.

The address output unit 120 includes a plurality of output ports, and the respective output ports output the complements of the present states in response to a toggle enabling signal TEN applied thereto so that the output sums EFMQ0 to EFMQ11 of the respective output ports become symbol addresses of an EFM demodulated signal.

It will be appreciated that the enabling signal generator 122 supplies an enabling signal enabled by toggle enabling signal TEN to the address output unit 120 so that the address output unit 120 sequentially outputs predetermined symbol addresses, as shown in the memory map of FIG. 5B, by a logical combination of the output values fed back from the address output unit 120 and the toggle enabling signal TEN, which determines the output of the address output unit 120.

FIGS. 10A and 10B show the relationship of the inputs and outputs of the EFM counter 80 shown in FIG. 9. FIG. 10A illustrates the process for generating the output addresses EFMQ corresponding to the respective EFM demodulated signals EF31 to EF0 according to the enabling signal output from the enabling signal generator 122. These are indicated as decimal, hexadecimal and binary numbers. It should be appreciated that the result is the same as the values of the EFM counter portion of the table shown in FIG. 5A. FIG. 10B shows the simulation result for the output addresses of the EFM counter 80 in the exemplary case where the TEN signal and control signals XCK and RB shown in FIG. 10A are applied. It should be appreciated that the result is the same as the values of the table shown in FIG. 10A.

Figure 11:
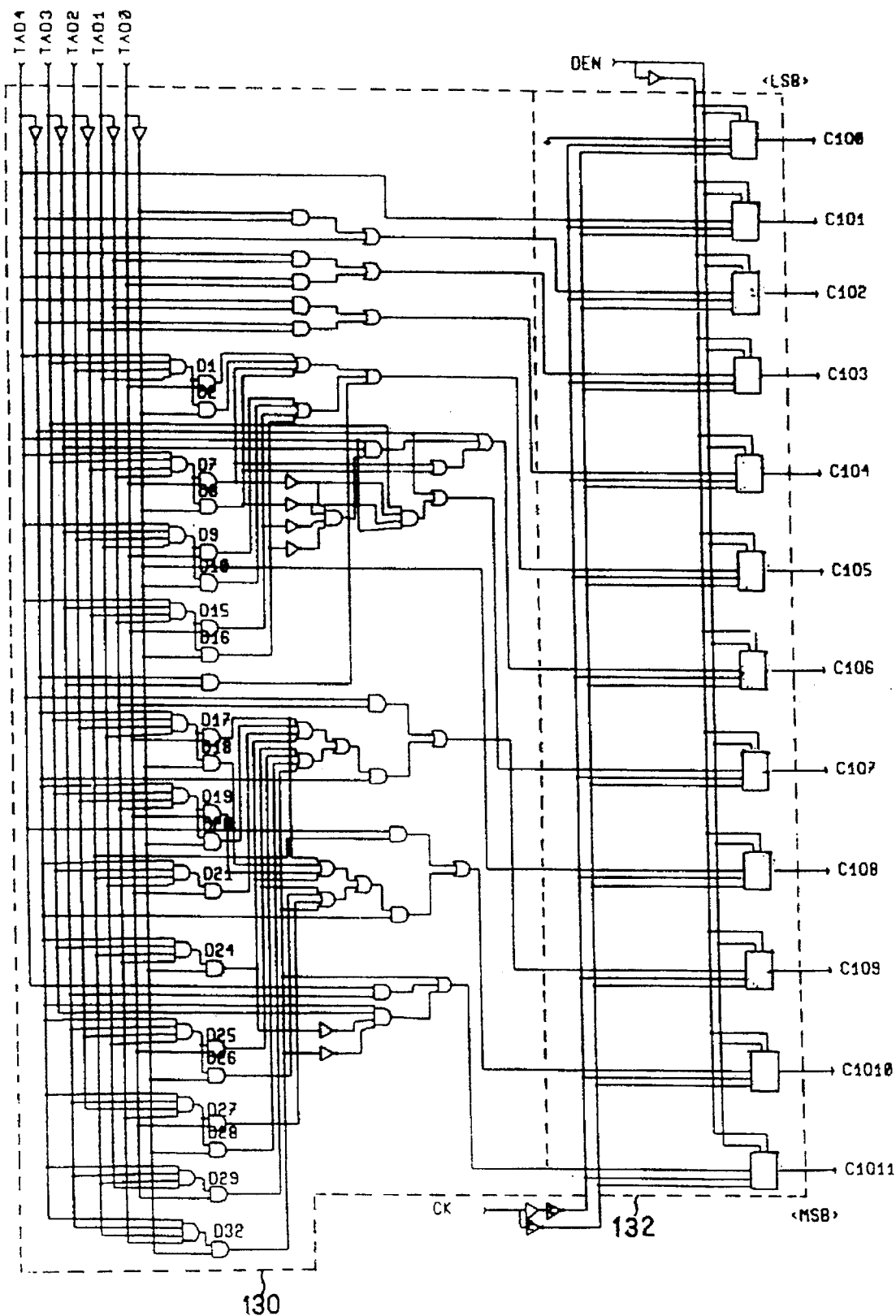
FIG. 11 is a detailed circuit diagram of the C1 decoder counter shown in FIG. 7.

FIG. 11 is an exemplary detailed circuit diagram of the C1 decoder counter 100, which includes an address output unit 132 for outputting the symbol addresses of the data symbols or parity symbols belonging to the encoding word C1, and a logic signal generator 130 for controlling the address output unit 132.

The operation according to the above-described configuration will now be explained. The address output unit 132 includes a plurality of output ports, which output the values of the present states in response to a direct enable (DEN) signal applied thereto so that the output sums C1Q0 to C1Q11 of the respective output ports become symbol addresses of the data symbols or parity symbols belonging to the encoding word C1.

The address output unit 132 sequentially outputs the symbol addresses of the data symbols or parity symbols belonging to the encoding word C1 responsive to the logical combination of a plurality of input signals TAD0 to TAD4 in logic signal generator 130. It should be noted that input signals TAD0 to TAD4 originate in ECC 28 and are supplied to address generator 32' of FIG. 23 to thereby enable address generator 32' to sequentially read out data stored in RAM 30. In short, TAD0 through TAD4 determine the sequence used in reading data from RAM 30.

FIG. 12 is a table which is useful in understanding the relationship between the inputs and outputs of the C1 decoder counter 100 shown in FIG. 11. The absolute addresses of the data symbols or parity symbols belonging to the encoding word C1 are output from the address output unit 130. These are indicated as decimal, hexadecimal and binary numbers, with respect to the relative addresses TAD0 to TAD4 input to the logic signal generator 130. It should be appreciated that the result is the same as the values of the table shown in FIG. 5A.

Figure 13:
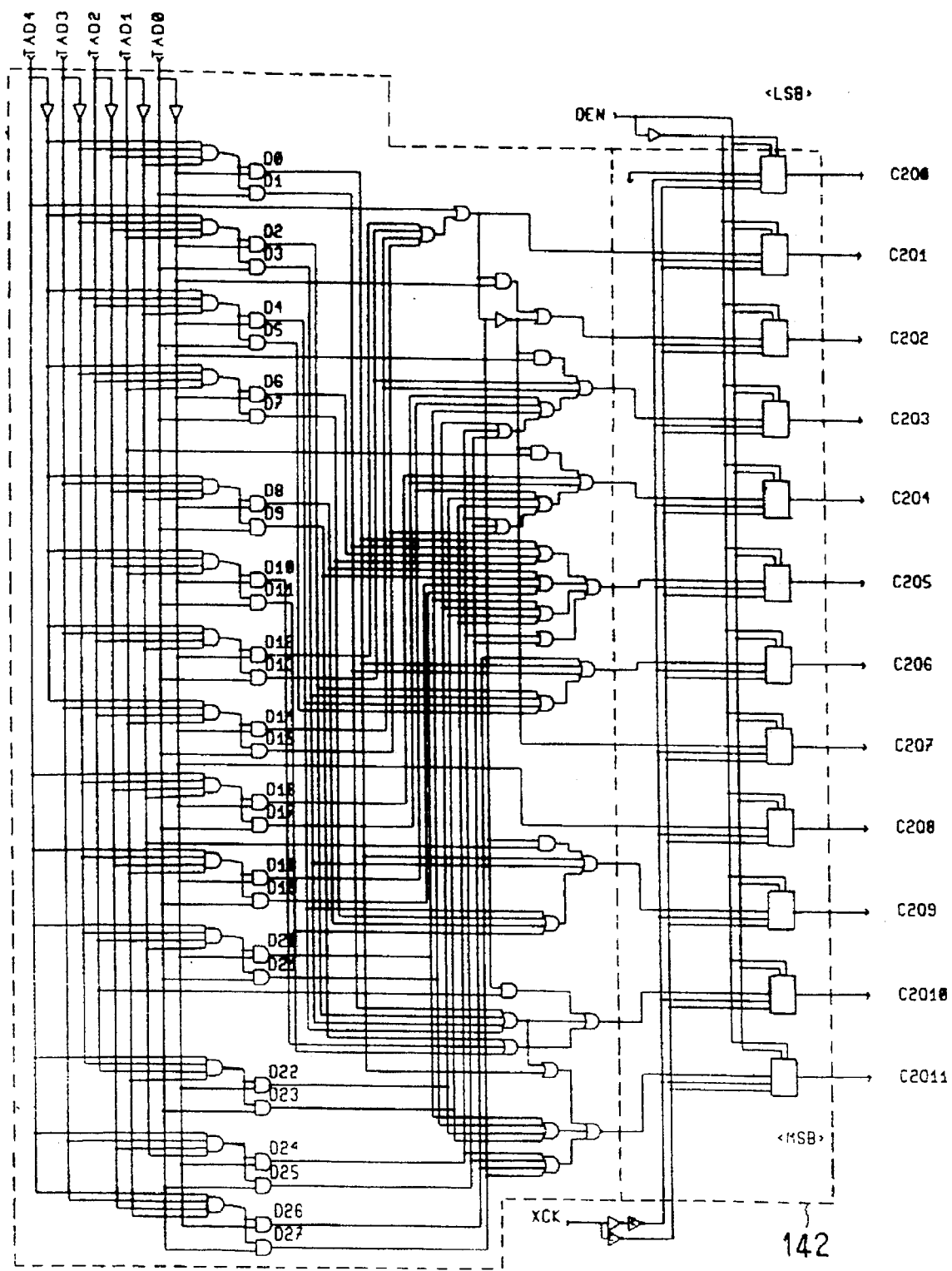
FIG. 13 is a detailed circuit diagram of the C2 decoder counter shown in FIG. 7.

FIG. 13 is an exemplary detailed circuit diagram of the C2 decoder counter 102 which advantageously includes an address output unit 142 for providing the symbol addresses of the data symbols or parity symbols belonging to the encoding word C2, and an logic signal generator 140 for controlling the address output unit 142. In the circuit of FIG. 13, the address output unit 142 includes a plurality of output ports, which output the values of the present states in response to the DEN signal applied thereto so that the output sums C2Q0 to C2Q11 of the respective output ports become symbol addresses of the data symbols or parity symbols belonging to the encoding word C2.

The logic signal generator 140 supplies logic signals to the address output unit 142, permitting the address output unit 142 to sequentially output the symbol addresses of the data symbols or parity symbols belonging to the encoding word C2, in response to logical combination of the input signals TAD0 to TAD4. It will be appreciated that address output unit 142 is operative in response to an applied DEN signal.

FIG. 14 is a table which is useful in understanding the relationship between the inputs and outputs of the C2 decoder counter 102 of FIG. 13. The absolute addresses of the data symbols or parity symbols belonging to the encoding word C2 are output from the address output unit 140, with respect to the relative addresses TAD0 to TAD4 input to the logic signal generator 140. It should be appreciated that the result is the same as the values of the table shown in FIG. 5A.

Figure 15:
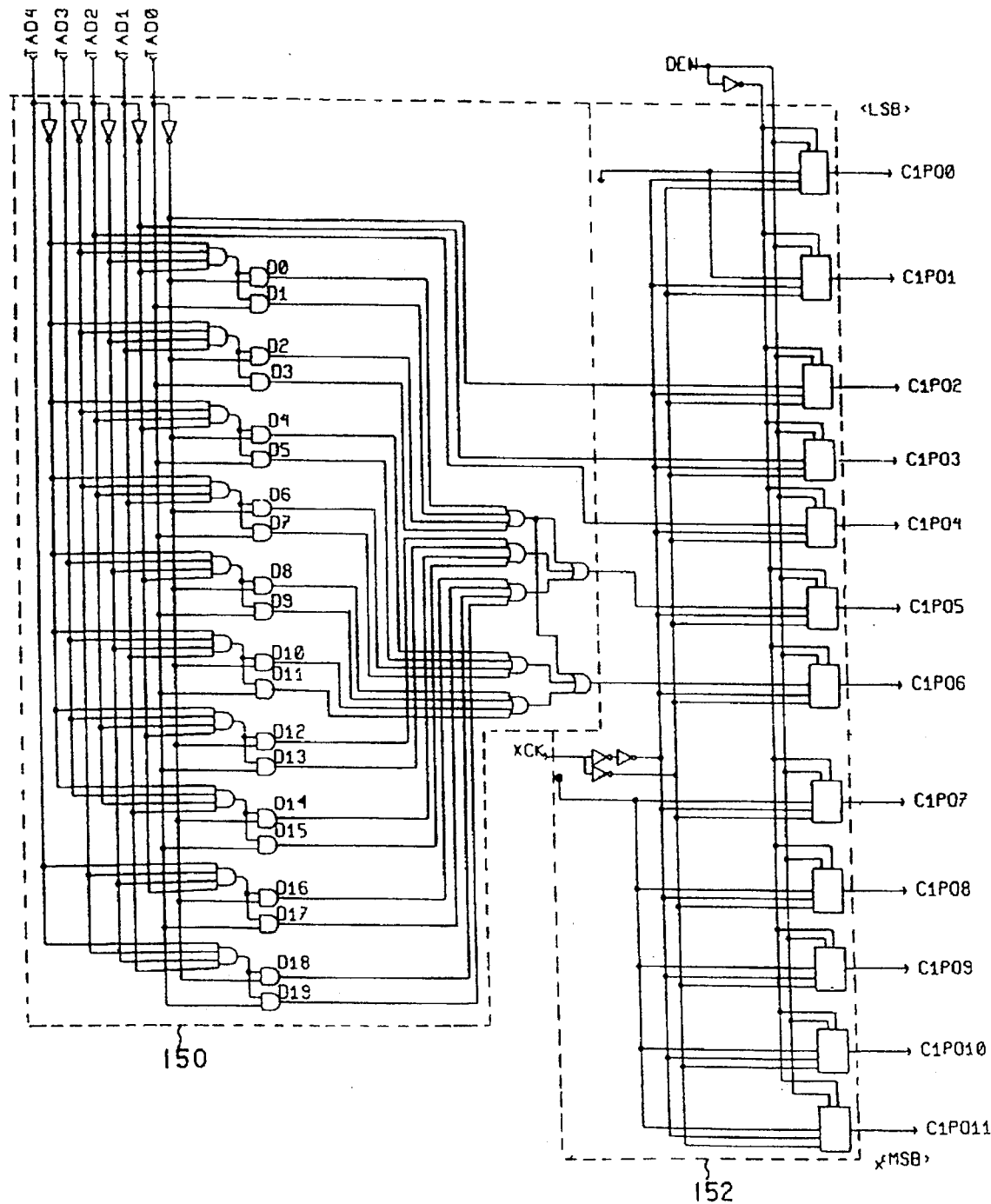
FIG. 15 is a detailed circuit diagram of the C1P decoder counter shown in FIG. 7.

FIG. 15 is an exemplary detailed circuit diagram of the C1P decoder counter 104 of FIG. 7, which preferably includes an address output unit 152 for outputting the symbol addresses of the C1 flag with respect to the error correction of the data symbol C1 and n logic signal generator 150 for controlling the address output unit 152. According to the circuitry of FIG. 15, the address output unit 152 includes a plurality of output ports, which output the values of the present states in response to logic signals and a DEN signal applied thereto so that the output sums C1PQ0 to C1PQ11 of the respective output ports become symbol addresses of the C1 flag with respect to the error correction of data symbol C1.

The logic signal generator 150 supplies the logic signals to the address output unit 152 so that the address output unit 152 sequentially outputs the symbol addresses of the C1 flag responsive to the DEN signal with respect to the error correction of the data symbol C1 by logical combination of the input signals TAD0 to TAD4.

Figure 17:
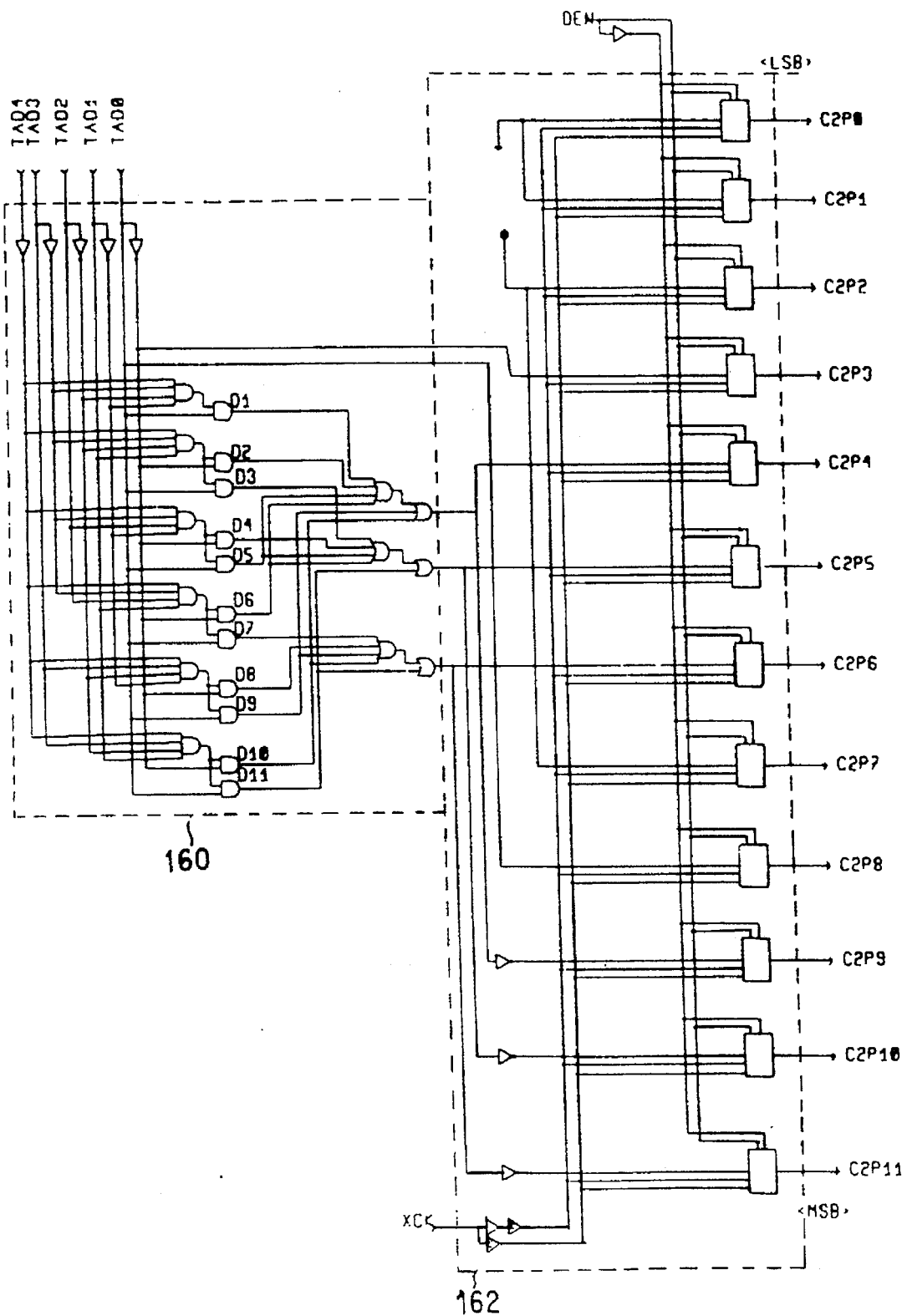
FIG. 17 is a detailed circuit diagram of the C2P decoder counter shown in FIG. 7.

FIG. 16 is a table which is useful in understanding the relationship between the input and output of the C1P decoder counter 104 of FIG. 15. The absolute addresses of the flag C1 with respect to the error correction of data symbol C1 are output from the address output unit 152, according to the relative addresses TAD0 to TAD4 input to the logic signal generator 150. It will be appreciated that the result is the same as the values of the table shown in FIG. 5A FIG. 17 is an exemplary detailed circuit diagram of the C2P decoder counter 106, which preferably includes an address output unit 162 for outputting the symbol addresses of the C2 flag with respect to the error correction of the data symbol C2 and an logic signal generator 160 for controlling the address output unit 162. The address output unit 162 includes a plurality of output ports, which output the values of the present states in response to the DEN signal applied thereto so that the output sums C2P0 to C2P11 of the respective output ports from symbol addresses of the C2 flag with respect to the error correction of data symbol C2.

The logic signal generator 160 supplies the logic signals to the address output unit 162 so that the address output unit 162 sequentially outputs the symbol addresses of the flag C2 with respect to the error correction of the data symbol C2 in response to the logical combination of the input signals TAD0 to TAD4 and the DEN signal.

FIG. 18 is a table which is useful in understanding the relationship between the input and output of the C2P decoder counter of FIG. 17. The absolute addresses of the flag C2 with respect to the error correction of data symbol C2 are output from the address output unit 162, according to the relative addresses TAD0 to TAD4 input to the logic signal generator 160. It will be appreciated that the result is the same as the values of the table shown in FIG. 5A.

Figure 19A:
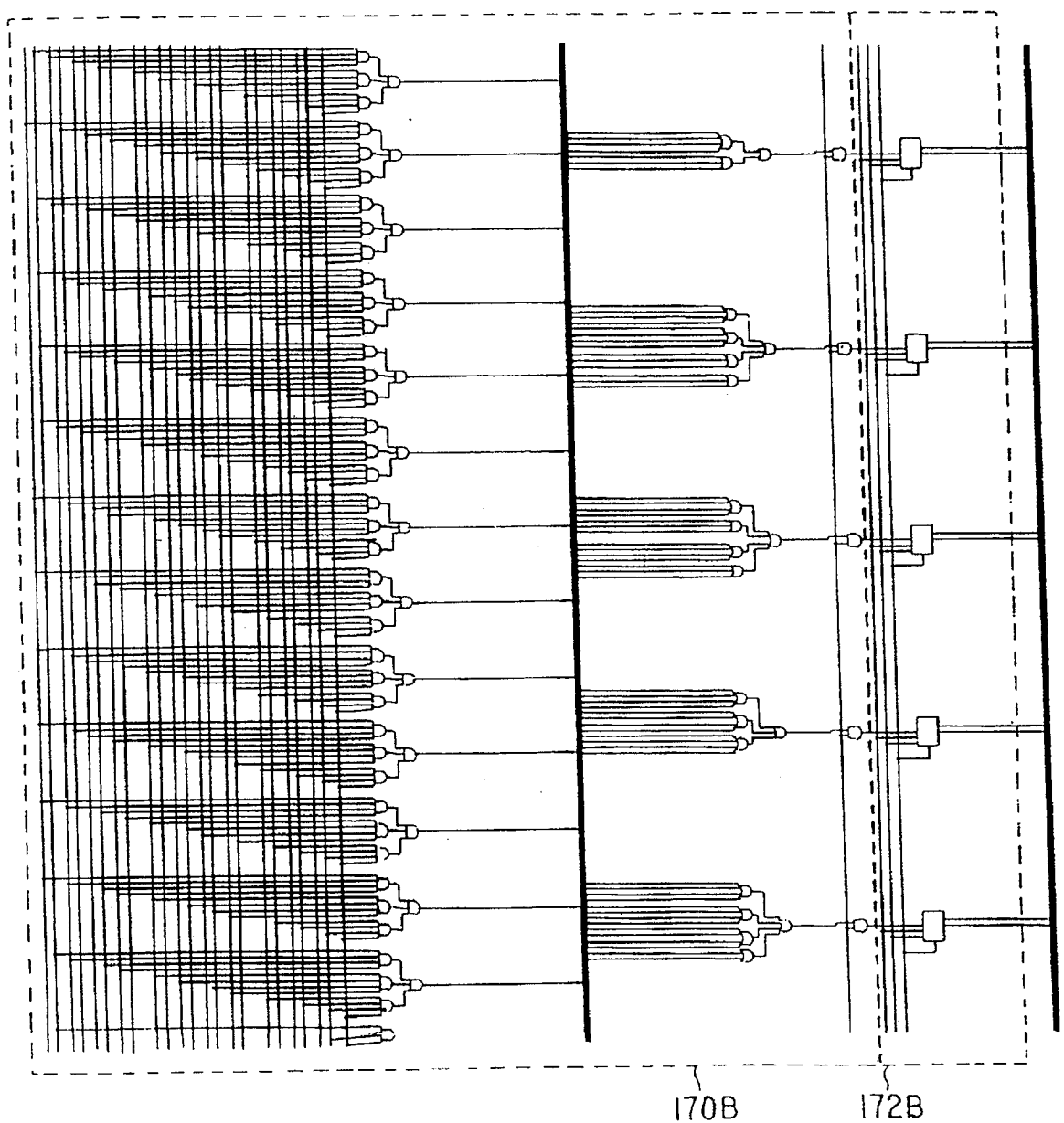
FIGS. 19A, 19B and 19C are detailed circuit diagrams of the DAC counter shown in FIG. 6.
Figure 19B:
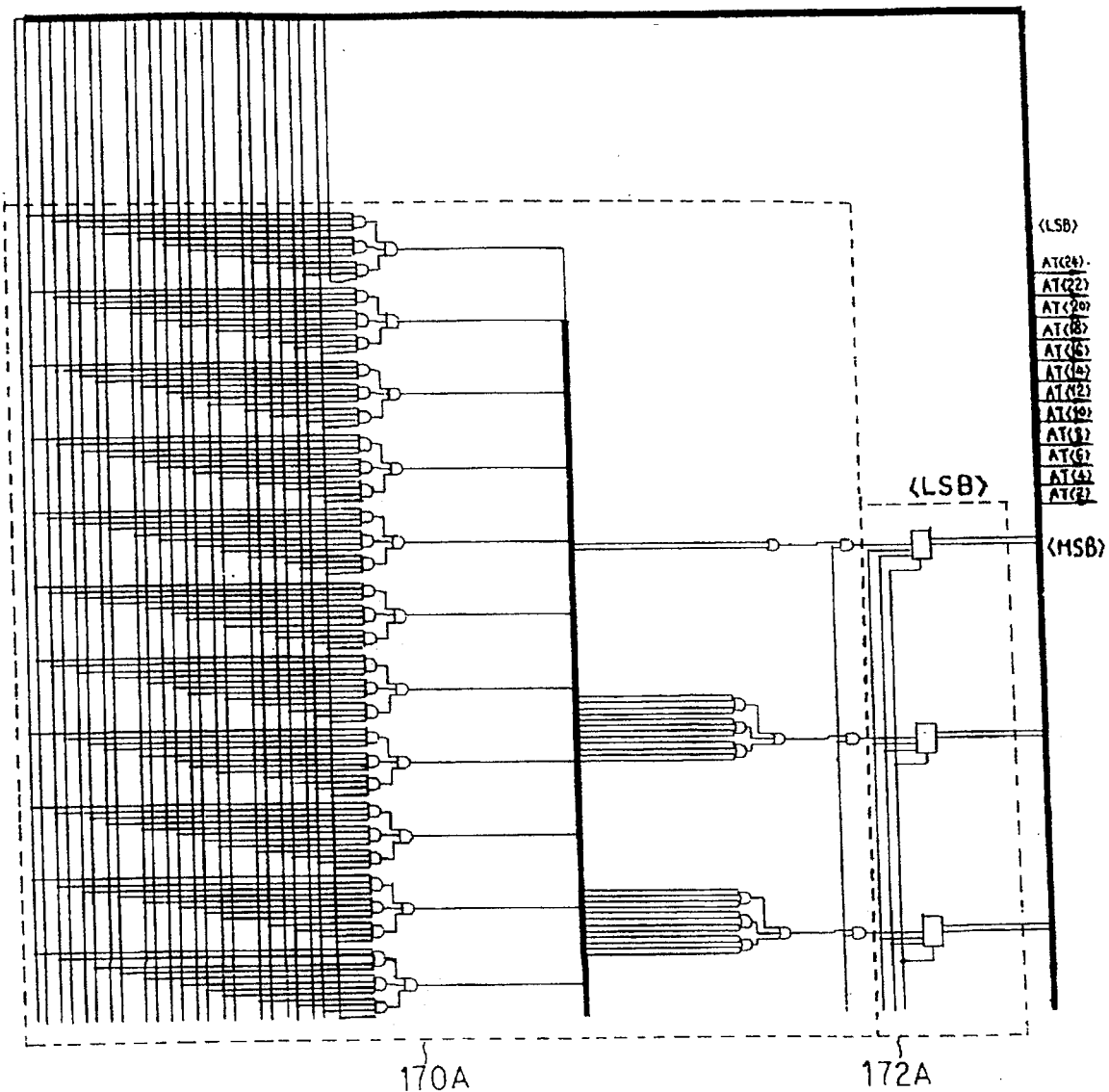
Figure 19C:
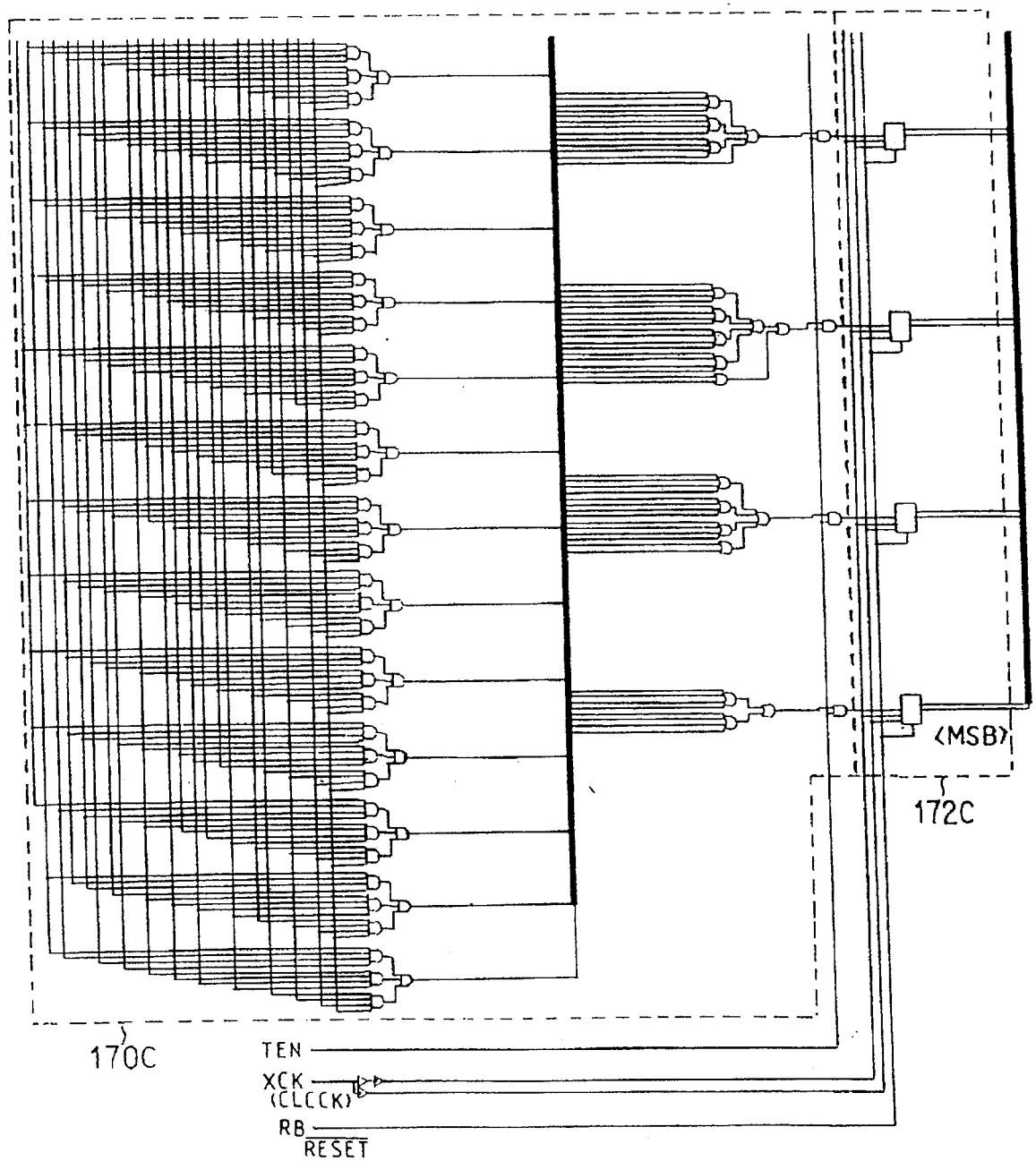

FIGS. 19A, 19B and 19C collectively form an exemplary detailed circuit diagram of the DAC counter 84, which preferably includes an address output unit 172A to 172C for outputting the symbol addresses necessary for converting the data symbols of the digital signals stored in RAM 92 into analog signals and an enabling signal generator 170A to 170C for controlling the address output unit 172A to 172C. The address output unit 172A to 172C includes a plurality of output ports, and the respective output ports output the complements of the present states in response to an enabling signal applied thereto so that the output sum of the respective output ports form symbol addresses necessary for converting the data symbols of digital signals, whose errors are corrected and which are stored in a predetermined order in RAM 92, into analog signals.

The enabling signal generator 170A to 170C supplies the enabling signal to the address output unit 172A to 172C so that the address output unit 172A to 172C sequentially outputs predetermined symbol addresses by a logical combination of the output values fed back from the address output unit 172A to 172C and the toggle enabling signal TEN, which determines the output of the address output unit 172A to 172C.

FIGS. 20A and 20B are tables which are useful in understanding the relationship between the inputs and outputs of the DAC counter 84 of FIGS. 19A, 19B and 19C. FIG. 20A, shows the output addresses QQ corresponding to the D/A converting signals DA0 to DA23 and the flags DF0 to DF22 with respect to the error correction of data symbols C1 and C2. FIG. 20B shows the simulation result for the DAC counter 84. FIGS. 20A and 20B show that the result is the same as the values of the table shown in FIG. 5A.

FIG. 21 is a detailed circuit diagram of the reading base counter 110 of FIG. 8, which is formed by up-counters. The reading base counter 110 includes a plurality of output ports and counts the 7.35 KHz clock signals of two channels L and R, which are derived from the crystal oscillator 38 of FIG. 23. The respective output ports increase by one in response to the frame synchronization signal when the DEN signal is applied thereto so that the output sum of the respective output ports become frame addresses, which differentiate the positions of the respective symbols belonging to another frame within RAM 92, when the respective symbols or flags are read from RAM 92.

FIG. 22 is a detailed circuit diagram of the recording base counter 112 of FIG. 8, which is also formed using up-counters, i.e., similar to the reading base counter 110. The recording base counter 112 includes a plurality of output ports and counts the frame synchronization signal generated by the VCO of FIG. 23. The respective output ports increase by one in response to the frame synchronization signal when the DEN signal is applied thereto so that the output sum of the respective output ports become frame addresses, which differentiate the positions of the respective symbols belonging to another frame within RAM 92, when the respective symbols or flags are recorded to RAM 92. Each output port illustrated in FIGS. 9, 11, 13, 15, 17, 19A, 19B and 19C is formed from a plurality of flip-flops.

As described above, the address generator according to the present invention generates the addresses necessary for recording EFM demodulated data in a predetermined area of a memory in the demodulator of an optical disk system, reading and recording the data for an error detection and correction of an EFM demodulated signal, and reading the data for converting error-corrected digital signals into analog signals by using a scrambling counter and a decoder, thereby enabling the quick generation of addresses while reducing chip space.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An address generator for generating predetermined addresses used in addressing a memory necessary for dividing a plurality of data symbols and a plurality of parity symbols which belong to the same frame, said data and said parity symbols having been demodulated in a predetermined manner into respective symbols, and then storing them within a predetermined area of the memory, said address generator comprising:

first counting means for sequentially generating said predetermined addresses respectively corresponding to said data symbols and said parity symbols which belong to said same frame while circulating by a period corresponding to one frame;

second counting means for generating frame addresses which differentiate positions of respective data and parity symbols or flags belonging to another frame within said memory, when said respective symbols or flags are written to or read from said memory; and an adder for adding said symbol addresses output from said first counting means and the frame addresses output from said second counting means and providing a result to said memory, wherein said first counting means comprises:

an address output unit having a plurality of output ports for generating complements of present states in response to a first enabling signal applied thereto so that output sums of said respective output ports form said symbol addresses; and an enabling signal generator for supplying a second enabling signal to said address output unit so that said address output unit sequentially outputs predetermined said symbol addresses by logical combination of output values fed back from said address output unit and said second enabling signal which determines the output of said address output unit.

2. The address generator as claimed in claim 1, wherein said output ports of said address output unit comprise a plurality of flip-flops synchronized with clocks signals applied to said respective output ports, which flip-flops output complements of said present state values while said first enabling signal is applied to said respective output ports.

3. The address generator as claimed in claim 1, wherein said enabling signal generator comprises a plurality of logical elements characterized in that said first enabling signal is supplied only to a corresponding port among said output ports when a next state value of a next clock pulse to be output from said respective output ports is the complement of a present state value of a present clock pulse.

4. An address generator for addressing a memory necessary for an error detection and correction process using two series encoding words (C1) and (C2) which are stored in the memory each in a predetermined order each including a plurality of data symbols and a plurality of parity symbols, said address generator comprising:

first counting means for synchronizing in a predetermined order symbol addresses respectively corresponding to said data symbols and said parity symbols belonging to a first series encoding word (C1) with the error detection and correction process of said first series encoding word (C1) to thereby sequentially output synchronized symbol addresses;

second counting means for synchronizing in a predetermined order the symbol addresses respectively corresponding to said data symbols and said parity symbols belonging to a second series encoding word (C2) with said error detection and correction process of said second series encoding word (C2) to thereby sequentially output synchronized symbol addresses;

third counting means for generating the addresses for addressing a memory with respect to a first flag (C1P) for indicating whether an error of each symbol for said first series encoding word (C1) is corrected;

fourth counting means for generating the addresses for addressing a memory with respect to a second flag (C2P) for indicating whether an error of each symbol for said second series encoding word (C2) is corrected;

selective output means for selectively providing only one among respective outputs from said first, said second, said third and said fourth counters;

fifth counting means for generating a frame address for differentiating positions of respective symbols or respective flags belonging to another frame within said memory, when said respective symbols or respective flags are recorded to or read from said memory; and an adder for adding said address output from said selective output means and said frame address output from said fifth counting means and then providing a result to said memory.

5. The address generator as claimed in claim 4, wherein at least one of said first, said second, said third, said fourth and said fifth counting means comprises a scrambling counter.

6. The address generator as claimed in claim 4, wherein said first counting means comprises:

an address output unit having a plurality of output ports for providing present state values in response to an enabling signal applied thereto so that the respective outputs of respective output ports form said symbol addresses; and a logic signal generator for supplying a logic signal to said address output unit so that said address output unit sequentially outputs predetermined said symbol addresses responsive to logical combination of a plurality of input signals.

7. The address generator as claimed in claim 6, wherein said output ports of said address output unit comprise a plurality of flip-flops synchronized with a clock signal applied to said respective output ports, which flip-flops output present state values while said enabling signal is applied to said respective output ports.

8. The address generator as claimed in claim 6, wherein said logic signal generator comprises a plurality of logic elements characterized in that said logical signal is supplied only to a corresponding port among said output ports responsive to said enabling signal when a next state value of the next clock pulse to be output from said respective output ports is the same as said present state value of a present clock pulse.

9. The address generator as claimed in claim 4, wherein said second counting means comprises:
   an address output unit having a plurality of output ports, for providing present state values in response to an enabling signal applied thereto so that the outputs of said respective output ports form said symbol addresses; and
   a logic signal generator for supplying a logic signal to said address output unit so that said address output unit sequentially outputs said symbol addresses by predetermined logical combination of a plurality of input signals.

10. The address generator as claimed in claim 9, wherein said output ports of said address output unit comprise a plurality of flip-flops which are synchronized with clock signals applied to said respective output ports and output said present state values while said enabling signal is applied to said respective output ports.

11. The address generator as claimed in claim 10, wherein said logic signal generator comprises a plurality of logic elements characterized in that said logic signal is supplied to a corresponding port among said output ports responsive to said enabling signal when a next state value of a next clock pulse to be output from respective output ports is the compliment of the present state value of a present clock pulse.

12. The address generator as claimed in claim 4, wherein said third counting means comprises:
   an address output unit having a plurality of output ports for outputting the present state values in response to an enabling signal applied thereto so that outputs of said respective output ports form said symbol addresses; and
   a logic signal generator for supplying a logic signal to said address output unit so that said address output unit sequentially outputs predetermined said symbol addresses by logical combination of a plurality of input signals.

13. The address generator as claimed in claim 12, wherein said output ports of said address output unit comprise a plurality of flip-flops synchronized with a clock signal applied to said respective output ports which flip-flops output said present state values while said enabling signal is applied to said respective output ports.

14. The address generator as claimed in claim 13, wherein said logic signal generator comprises a plurality of logic elements characterized in that said logic signal is supplied to a corresponding port among said output ports responsive to said enabling signal when a next state value of a next clock pulse to be output from said respective output ports is the compliment of a present state value of a present clock pulse.

15. The address generator as claimed in claim 4, wherein said fourth counting means comprises:
   an address output unit having a plurality of output ports for providing present state values in response to an enabling signal applied thereto so that outputs of said respective output ports form said symbol addresses; and
   a logic signal generator for supplying a logic signal to said address output unit to thereby permit sequential output of said symbol addresses by predetermined logical combination of a plurality of input signals.

16. The address generator as claimed in claim 15, wherein said output ports of said address output unit comprise a plurality of flip-flops synchronized with a clock signal applied to said respective output ports, which flip-flops output said present state values while said enabling signal is applied to said respective output ports.

17. The address generator as claimed in claim 16, wherein said logic signal generator comprises a plurality of logic elements characterized in that said logic signal is supplied to a corresponding port among said output ports responsive to said enabling signal when a next state value of a next clock pulse to be output from said respective output ports is the compliment of a present state value for a present clock pulse.

18. An address generator for generating the addresses for addressing a memory necessary for converting respective data symbols of digital signals, whose errors are corrected and then are stored in said memory in a predetermined order, into analog signals, said address generator comprising:
   first counting means for sequentially generating symbol addresses or flag addresses in a predetermined order respectively corresponding to said data symbols or flags indicative of an error correction of said respective data symbols, wherein said first counting means is a scrambling counter and does not include a read only memory;
   second counting means for generating frame addresses which differentiate positions of respective symbols or respective flags belonging to another frame within said memory, when said respective symbols or said respective flags are written to or read from said memory; and
   an adder for adding said symbol addresses or said flag addresses output from said first counting means and said frame addresses output from said second counting means and then providing a result to said memory.

19. An address generator for generating the addresses for addressing a memory necessary for converting respective data symbols of digital signals, whose errors are corrected and then are stored in said memory in a predetermined order, into analog signals, said address generator comprising:
   first counting means for sequentially generating symbol addresses or flag addresses in a predetermined order respectively corresponding to said data symbols or flags indicative of an error correction of said respective data symbols;
   second counting means for generating frame addresses which differentiate positions of respective symbols or respective flags belonging to another frame within said memory, when said respective symbols or said respective flags are written to or read from said memory; and
   an adder for adding said symbol addresses or said flag addresses output from said first counting means and said frame addresses output from said second counting means and then providing a result to said memory,
   wherein said first counting means comprises:
      address output unit having a plurality of output ports, for generating complements of said present states in response to first enabling signal applied thereto so that outputs of said respective output ports form said symbol addresses or said flag addresses; and an enabling signal generator for supplying said first enabling signal to said address output unit so that said address output unit sequentially outputs said symbol addresses by predetermined logical combination of the output values fed back from said address output unit and a second enabling signal determining the output values of said address output unit.

20. The address generator as claimed in claim 19, wherein said output ports of said address output unit comprise a plurality of flip-flops synchronized with a clock signal applied to said respective output ports, which flip-flops output complements of the present state values while said first enabling signal is applied to said respective output ports.

21. The address generator as claimed in claim 19, wherein said enabling signal generator comprises a plurality of logic elements characterized in that said first enabling signal is supplied only to a corresponding port among said output ports while a next state value of a next clock pulse to be output from said respective output ports is a complement of the present state value of a present clock pulse.

22. An address generator comprising:

first counting means for sequentially generating predetermined first addresses respectively corresponding to a plurality of data symbols and a plurality of parity symbols belonging to the same frame and while circulating in a period of one frame so that said data symbols and said parity symbols belonging to said same frame are divided into respective symbols and stored within a predetermined area of a memory;

second counting means for generating second addresses for addressing said memory necessary for recording or reading a first flag corresponding to said respective symbols representing a series first encoding word (C1) and a second flag corresponding to said respective symbols representing a series second encoding word (C2) with respect to an error correction of said data symbols, or for generating said symbol addresses of said data symbols or said parity symbols belonging to the two series first and second encoding words (C1 and C2), in order to detect and correct said error using said two series encoding words (C1 and C2) stored in said memory;

third counting means for sequentially outputting in a predetermined order the symbol addresses or the flag addresses respectively corresponding to said data symbols and said second flags corresponding to said respective symbols of the second encoding word (C2) with respect to error correction of said respective data symbols, in order to convert said data symbols, whose errors are corrected and which are stored in said memory in a predetermined order, into analog signals;

selective output means connected to each output terminal of said first counting means, said second counting means and said third counting means, for selectively providing one from among said addresses respectively output from said first counting means, said second counting means, and said third counting means;

fourth counting means for generating frame addresses for differentiating positions of respective symbols and respective flags belonging to another frame within said memory, when said respective symbols or said respective flags are recorded to or read from said memory; and an adder for adding said symbol addresses or said flag addresses output from said selective output means and said frame addresses output from said fourth counting means and then providing a result to said memory.

23. The address generator as claimed in claim 22, wherein at least one of said first, said second, said third and said fourth counting means is a scrambling counter.

* * * * *